US012740354B2

(12) United States Patent
Onozawa

(10) Patent No.: US 12,740,354 B2
(45) Date of Patent: Sep. 15, 2026

(54) SEMICONDUCTOR DEVICE AND METHOD FOR MANUFACTURING THE SAME

(71) Applicant: FUJI ELECTRIC CO., LTD., Kawasaki (JP)

(72) Inventor: Yuichi Onozawa, Matsumoto-city (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 387 days.

(21) Appl. No.: 18/487,724

(22) Filed: Oct. 16, 2023

(65) Prior Publication Data

US 2024/0047200 A1 Feb. 8, 2024

Related U.S. Application Data

(60) Continuation of application No. 17/120,093, filed on Dec. 11, 2020, now Pat. No. 11,823,898, which is a (Continued)

(30) Foreign Application Priority Data

Oct. 23, 2012 (JP) ................................ 2012-233650

(51) Int. Cl.
*H10P 14/60* (2026.01)
*H10D 8/00* (2025.01)
(Continued)

(52) U.S. Cl.
CPC ......... *H10P 14/6539* (2026.01); *H10D 8/045* (2025.01); *H10D 8/411* (2025.01); (Continued)

(58) Field of Classification Search
CPC ......... H01L 21/02351; H01L 21/02304; H01L 21/263; H10D 8/045; H10D 8/411; (Continued)

(56) References Cited

U.S. PATENT DOCUMENTS 8,766,413 B2 7/2014 Nemoto et al.
9,276,071 B2 3/2016 Yoshimura et al.
(Continued)

FOREIGN PATENT DOCUMENTS

CN 102687277 A 9/2012
CN 103946983 A 7/2014
(Continued)

OTHER PUBLICATIONS

Extended European Search Report issued in European Appln. No. 13848817.6 mailed Jun. 17, 2016.

(Continued)

*Primary Examiner* — Bitew A Dinke
(74) *Attorney, Agent, or Firm* — Rabin & Berdo, P.C

(57) ABSTRACT

A semiconductor device, including: a semiconductor substrate having first and second main surfaces, and an n-type drift layer therein; a p-type layer provided between the first main surface and the drift layer; and an n-type high-concentration layer provided between the second main surface and the drift layer, and including a plurality of buffer layers. A carrier concentration of the semiconductor device is higher in the n-type high-concentration layer than in the semiconductor substrate. In one of the buffer layers, the carrier concentration decreases both upward and downward in a depth direction of the semiconductor device, from a peak concentration thereof at a peak position to a predetermined concentration at first and second depth positions respectively above and below the peak position. In the depth direction, a distance between the first depth position and the peak position is larger than a distance between the peak position and the second depth position.

22 Claims, 11 Drawing Sheets

Related U.S. Application Data continuation of application No. 16/207,333, filed on Dec. 3, 2018, now Pat. No. 10,867,790, which is a division of application No. 14/640,812, filed on Mar. 6, 2015, now Pat. No. 10,176,986, which is a continuation of application No. PCT/JP2013/076434, filed on Sep. 27, 2013.

(51) Int. Cl.

| | |
|---|---|
| ***H10D 8/01*** | (2025.01) |
| ***H10D 8/50*** | (2025.01) |
| ***H10D 12/00*** | (2025.01) |
| ***H10D 12/01*** | (2025.01) |
| ***H10D 62/10*** | (2025.01) |
| ***H10D 62/17*** | (2025.01) |
| ***H10D 62/53*** | (2025.01) |
| ***H10D 62/60*** | (2025.01) |
| ***H10D 62/834*** | (2025.01) |
| ***H10P 34/40*** | (2026.01) |
| *H10D 64/00* | (2025.01) |

(52) U.S. Cl.

CPC ............. *H10D 8/50* (2025.01); *H10D 12/032* (2025.01); *H10D 12/038* (2025.01); *H10D 12/441* (2025.01); *H10D 12/481* (2025.01); *H10D 62/106* (2025.01); *H10D 62/393* (2025.01); *H10D 62/53* (2025.01); *H10D 62/60* (2025.01); *H10D 62/605* (2025.01); *H10D 62/834* (2025.01); *H10P 14/6506* (2026.01); *H10P 34/40* (2026.01); *H10D 64/111* (2025.01); *H10D 64/112* (2025.01)

(58) Field of Classification Search

CPC ...... H10D 8/50; H10D 12/032; H10D 12/038; H10D 12/441; H10D 12/481; H10D 62/106; H10D 62/393; H10D 62/53; H10D 62/60; H10D 62/605; H10D 62/834; H10D 64/111; H10D 64/112; H10D 62/129; H10P 14/6539; H10P 14/6506; H10P 34/40

See application file for complete search history.

(56) References Cited

U.S. PATENT DOCUMENTS

| | | | | |
|---|---|---|---|---|
| 9,368,577 | B2 * | 6/2016 | Takishita | H10D 8/00 |
| 9,722,016 | B2 * | 8/2017 | Takishita | H01L 21/263 |
| 10,056,449 | B2 * | 8/2018 | Takishita | H10D 62/53 |
| 10,176,986 | B2 * | 1/2019 | Onozawa | H10D 62/834 |
| 10,199,453 | B2 * | 2/2019 | Takishita | H01L 21/263 |
| 10,651,269 | B2 * | 5/2020 | Takishita | H10D 8/00 |
| 10,867,790 | B2 * | 12/2020 | Onozawa | H10D 8/50 |
| 11,342,186 | B2 | 5/2022 | Agata et al. | |
| 2002/0130331 | A1 | 9/2002 | Nemoto et al. | |
| 2006/0081923 | A1 | 4/2006 | Mauder et al. | |
| 2006/0138607 | A1 | 6/2006 | Nemoto | |
| 2006/0205112 | A1 | 9/2006 | Standing et al. | |
| 2006/0286753 | A1 | 12/2006 | Barthelmess et al. | |
| 2007/0120170 | A1 * | 5/2007 | Niedernostheide | H10D 30/66 257/302 |
| 2008/0054369 | A1 | 3/2008 | Schulze et al. | |
| 2008/0315364 | A1 | 12/2008 | Nemoto | |
| 2009/0184340 | A1 * | 7/2009 | Nemoto | H10D 62/53 257/E21.328 |
| 2009/0224284 | A1 | 9/2009 | Nemoto | |
| 2010/0244093 | A1 | 9/2010 | Rahimo et al. | |
| 2012/0267681 | A1 * | 10/2012 | Nemoto | H10D 62/124 257/139 |
| 2013/0264674 | A1 | 10/2013 | Mizushima | |
| 2014/0217407 | A1 | 8/2014 | Mizushima et al. | |
| 2014/0246755 | A1 | 9/2014 | Yoshimura et al. | |
| 2014/0291723 | A1 * | 10/2014 | Miyazaki | H10D 62/133 438/530 |
| 2014/0357026 | A1 * | 12/2014 | Kobayashi | H01L 21/263 438/530 |
| 2014/0374793 | A1 * | 12/2014 | Miyazaki | H01L 21/324 438/530 |
| 2015/0311279 | A1 | 10/2015 | Onozawa et al. | |

FOREIGN PATENT DOCUMENTS

| | | | | |
|---|---|---|---|---|
| DE | 102006046844 | A1 | 4/2008 | |
| EP | 1030375 | A1 | 8/2000 | |
| EP | 2793266 | A1 | 10/2014 | |
| JP | 2000077350 | A | 3/2000 | |
| JP | 2003152198 | A | 5/2003 | |
| JP | 2010541266 | A | 12/2010 | |
| WO | 0016408 | A1 | 3/2000 | |
| WO | WO-2011049054 | A1 * | 4/2011 | H10D 62/53 |
| WO | WO-2011052787 | A1 * | 5/2011 | H01L 21/263 |
| WO | 2012081664 | A1 | 6/2012 | |
| WO | 2013100155 | A1 | 7/2013 | |
| WO | 2013147274 | A1 | 10/2013 | |

OTHER PUBLICATIONS

International Search Report issued in Intl. Appln. No. PCT/JP2013/076434 mailed Nov. 5, 2013.

Notice of Allowance issued in U.S. Appl. No. 14/640,812 mailed Aug. 30, 2018.

Office Action issued in Chinese Patent Application No. 201380047299.X, mailed Oct. 9, 2016.

Office Action issued in U.S. Appl. No. 14/640,812 mailed Apr. 20, 2018.

Office Action issued in U.S. Appl. No. 14/640,812 mailed Apr. 1, 2016.

Office Action issued in U.S. Appl. No. 14/640,812 mailed Aug. 29, 2017.

Office Action issued in U.S. Appl. No. 14/640,812 mailed Jun. 29, 2016.

Office Action issued in U.S. Appl. No. 14/640,812 mailed Mar. 2, 2017.

Written Opinion issued in Intl. Appln. No. PCT/JP2013/076434 mailed Nov. 5, 2013.

* cited by examiner

| RATED VOLTAGE (V) | BREAKDOWN VOLTAGE (V) | TOTAL THICKNESS OF SUBSTRATE $W_0$ (μm) | RESISTIVITY (Ωcm) | RATED CURRENT DENSITY ($A/cm^2$) | DISTANCE INDEX $x_0$ (μm) | DEEPEST BUFFER LAYER: DISTANCE FROM REAR SURFACE Y (μm) [β DEPENDENCE] | | | | | | | | | | |
|---|---|---|---|---|---|---|---|---|---|---|---|---|---|---|---|---|
| | | | | | | β=0.5 | 0.6 | 0.7 | 0.8 | 0.9 | 1.0 | 1.1 | 1.2 | 1.3 | 1.4 | 1.5 |
| 600 | 700 | 60 | 30 | 350 | 30.4 | 41.8 | 38.7 | 35.7 | 32.7 | 29.6 | 26.6 | 23.5 | 20.5 | 17.5 | 14.4 | 11.4 |
| 1200 | 1400 | 120 | 60 | 175 | 60.8 | 86.6 | 80.5 | 74.4 | 68.3 | 62.2 | 56.2 | 50.1 | 44.0 | 37.9 | 31.8 | 25.7 |
| 1700 | 1900 | 170 | 85 | 125 | 85.9 | 124.1 | 115.5 | 106.9 | 98.3 | 89.7 | 81.1 | 72.6 | 64.0 | 55.4 | 46.8 | 38.2 |
| 3300 | 3500 | 330 | 165 | 65 | 166.2 | 243.9 | 227.3 | 210.7 | 194.1 | 177.5 | 160.8 | 144.2 | 127.6 | 111.0 | 94.4 | 77.8 |
| 4500 | 4700 | 450 | 225 | 50 | 223.1 | 335.5 | 313.1 | 290.8 | 268.5 | 246.2 | 223.9 | 201.6 | 179.3 | 157.0 | 134.7 | 112.4 |
| 6500 | 6700 | 650 | 325 | 35 | 321.1 | 486.5 | 454.4 | 422.2 | 390.1 | 358.0 | 325.9 | 293.8 | 261.7 | 229.6 | 197.5 | 165.4 |

FIG.15

SEMICONDUCTOR DEVICE AND METHOD FOR MANUFACTURING THE SAME

BACKGROUND OF THE INVENTION

A. Field of the Invention

The present invention relates to a semiconductor device, such as a p-intrinsic-n (PiN) diode or an insulated gate bipolar transistor (IGBT) including a buffer layer formed by proton implantation, and a method for manufacturing the same.

B. Description of the Related Art

Examples of a power semiconductor device include a diode or an IGBT with a breakdown voltage of 400 V, 600 V, 1200 V, 1700 V, 3300 V, or more. The diode or the IGBT is used in a power conversion device such as a converter or an inverter. The power semiconductor device requires low loss, low noise, a high breakdown voltage, and low cost.

FIG. 8 is a cross-sectional view illustrating a main portion of a PiN diode 500 including a general n-type buffer layer 55. As illustrated in FIG. 8, the PiN diode 500 includes an n-type drift layer 52 which is a portion of an n-type silicon substrate 51. A p-type layer, which will be a p-type anode layer 53, is provided in a first main surface of the n-type silicon substrate 51 and an n-type cathode layer 54 and an n-type layer, which will be the n-type buffer layer 55, are formed in a second main surface opposite to the first main surface. Then, a p-type layer 62 (p-type guard ring layer), which will be a high-breakdown-voltage junction termination structure 61, is formed on the first main surface of the n-type silicon substrate 51 so as to surround the p-type anode layer 53. In FIG. 8, reference numeral 58 is an anode electrode, reference numeral 59 is a cathode electrode, reference numeral 63 is a termination electrode, and reference numeral 64 is an insulating film.

The n-type cathode layer 54 needs to have carrier concentration and a diffusion depth required to prevent reach-through of a depletion layer (which means that the depletion layer reaches the cathode electrode 59). For example, the n-type buffer layer 55 which has a higher impurity concentration than the n-type drift layer 52 is formed in the n-type drift layer 52 in order to suppress the spreading of the depletion layer. As a method for forming the n-type buffer layer 55 at a position that is deeper than the n-type cathode layer 54 from the second main surface of the n-type silicon substrate 51 so as to come into contact with the n-type cathode layer 54, a method has been proposed which uses a selenium (Se) atom with a large diffusion coefficient as a dopant ion that is implanted in order to form the n-type buffer layer 55. In addition, as another method for forming the n-type buffer layer 55, a method has been known which forms a hydrogen-related donor using the implantation of hydrogen (H) ions (protons) which have a long range at a relatively low acceleration voltage.

Next, the hydrogen-related donor will be described. When protons are implanted into the n-type silicon substrate 51 (for example, a bulk substrate (wafer) formed by a floating zone (FZ) method) including an oxygen (O) atom, a hydrogen (H) atom and the oxygen (O) atom are combined with a vacancy (V) defect which occurs due to the implantation to generate a composite defect. As a result, a vacancy-oxide-hydrogen (VOH) defect occurs. The VOH defect becomes a donor (hydrogen-related donor) which supplies an electron. When a heat treatment is performed after the proton implantation, the density of the VOH defects increases and donor concentration also increases. Therefore, the n-type buffer layer 55 which has a higher impurity concentration than the n-type drift layer 52 is formed.

An activation process for increasing the donor concentration of the VOH defect can be implemented by low-temperature annealing (heat treatment) which is performed at a temperature of about 380° C. Therefore, a front surface structure which is formed by a high-temperature process is formed on a thick wafer before a thickness reducing process (thinning process) in advance. Then, the rear surface of the wafer is ground and the wafer is thinned to a product thickness. Low-temperature annealing is performed to form a rear surface structure. Since annealing for forming the rear surface structure is performed at a low temperature, it is possible to form a front surface electrode or a passivation film forming the front surface structure on the thick wafer before the thinning process in advance in a process of forming a thin diode or a thin IGBT with a small product thickness. Therefore, in a process after the thickness of the wafer is reduced, only the rear surface electrode forming the rear surface structure is formed. As a result, it is possible to significantly reduce the number of processes after the wafer is thinned.

In the PiN diode 500, the n-type buffer layer 55 is formed in the n-type silicon substrate 51 between the p-type anode layer 53 and the n-type cathode layer 54 so as to be close to the p anode layer 53, and a layer with low carrier concentration remains on the cathode side. This structure makes it possible to improve the storage effect of holes which are minority carriers. As a result, it is possible to form a diode with good soft recovery characteristics even when the n-type drift layer 52 (a region of the n-type silicon substrate 51 between the p-type anode layer 53 and the n-type buffer layer 55) has a small thickness.

The n-type buffer layer 55 can be a thick n-type buffer layer with an equivalently broad carrier concentration distribution in the depth direction by implanting protons into the n-type silicon substrate 51 in different ranges Rp over a plurality of times. PCT Japanese Patent Domestic Re-publication No. 2000-16408 discloses the carrier concentration (impurity concentration) of an n-type layer formed by proton implantation. However, it does not disclose a method for reducing crystal defects caused by proton implantation.

JP 2000-77350 A discloses a method for performing annealing (heat treatment) at a temperature of 350° C. as the method for reducing the crystal defects caused by proton implantation. In US 2006/205,122 A, FIG. 2 illustrates an n-type buffer layer formed by proton implantation in an IGBT. In addition, US 2006/205,122 A discloses that the carrier concentration of the n-type buffer layer formed by changing protons into donors in a proton passage region is not less than the carrier concentration of a substrate.

In the following US 2006/286,753 A, FIGS. 3, 4, and 5 illustrate a thyristor, an IGBT, and a diode which include an n-type buffer layer similarly formed by changing protons into donors. In addition, US 2006/286,753 A discloses a technique which performs a heat treatment at a temperature of 200° C. to 550° C. to recover the crystal defects caused by proton implantation and to change protons into donors.

In US 2006/81,923 A, FIG. 2 illustrates the carrier concentration distributions of a plurality of n-type buffer layers which are obtained by changing protons into donors and are formed in a diode illustrated in FIG. 4 of US 2006/81,923 A or an IGBT illustrated in FIG. 5. In addition, US 2006/81, 923 A discloses that the carrier concentration of the n-type buffer layer formed by changing protons into donors in a proton passage region is not less than the carrier concentration of a substrate.

JP 2003-152198 A discloses a technique which forms an n-type buffer layer in a central portion of an n-type drift layer so that a diode has soft recovery characteristics.

However, when the number of stored carriers is small, such as when a small amount of current flows or when the temperature is low, electron concentration is close to donor concentration. Therefore, as described above, even when the n-type buffer layer 55 is formed so as to have a broad carrier concentration distribution, a charge neutral condition (electron concentration=donor concentration+hole concentration) is maintained by the negative charge of the electron and the positive charge of the donor. As a result, the concentration of holes, which are minority carriers, is significantly reduced and the holes are quickly depleted during reverse recovery, which results in a high surge voltage or oscillation.

When the breakdown voltage of the semiconductor device increases, the depth of the n-type buffer layer 55 needs to be more than 15 μm that is illustrated in FIG. 2 of the above-mentioned US 2006/81,923 A, in order to effectively suppress a high surge voltage or oscillation.

However, the acceleration energy of proton implantation needs to be increased in order to increase the depth of the n-type buffer layer 55. When the acceleration energy increases, a defect occurs in a crystal due to implantation damage. When the crystal defect is not recovered by a heat treatment for changing protons into donors, the remaining crystal defect acts as a lifetime killer for the stored carrier and the concentration of the minority carriers (holes) is reduced. As a result, during a switching operation, such as during the reverse recovery of the PiN diode 500 or when the IGBT is turned off, the holes, which are the minority carriers, are quickly depleted and a high surge voltage is generated or the voltage and current oscillate. The oscillation is radiated as radiation noise to the outside and causes an electromagnetic compatibility (EMC) problem. The crystal defect causes an increase in the leakage current of the PiN diode 500 or the IGBT.

The present invention provides a semiconductor device with a high breakdown voltage which includes an n-type buffer layer with a depth of 15 μm or more formed by proton implantation, has a small leakage current or small generation loss, and can suppress the oscillation of voltage and current during a switching operation and a method for manufacturing the same.

SUMMARY OF THE INVENTION

In order to solve the above-mentioned problems, a semiconductor device according to an aspect of the invention has the following characteristics. An n-type drift layer is provided in an n-type semiconductor substrate. A p-type layer is provided in a surface layer of a first main surface of the n-type semiconductor substrate so as to come into contact with the n-type drift layer. An n-type layer is provided in a second main surface of the n-type semiconductor substrate so as to come into contact with the n-type drift layer. The n-type layer includes a plurality of n-type buffer layers which are formed by changing hydrogen introduced into the n-type semiconductor substrate into a donor, and are provided at different depths from the second main surface of the n-type semiconductor substrate. The position of the peak carrier concentration of the closest buffer layer which is arranged at a position closest to the p-type layer among the plurality of n-type buffer layers is deeper than 15 μm from the second main surface of the n-type semiconductor substrate. The carrier concentration of a region interposed between the n-type buffer layers which are adjacent to each other in a depth direction is less than the peak carrier concentration of the n-type buffer layer and is equal to or more than the carrier concentration of the n-type semiconductor substrate.

In the semiconductor device according to the above-mentioned aspect of the invention, the carrier concentration of the n-type buffer layers, the region interposed between the n-type buffer layers which are adjacent to each other in the depth direction, and the n-type semiconductor substrate may be calculated from spreading resistance.

In the semiconductor device according to the above-mentioned aspect of the invention, the carrier concentration of the region interposed between the n-type buffer layers which are adjacent to each other in the depth direction may be equal to or more than the carrier concentration of the n-type semiconductor substrate and equal to or less than five times the carrier concentration of the n-type semiconductor substrate.

In the semiconductor device according to the above-mentioned aspect of the invention, a carrier concentration distribution of the region interposed between the n-type buffer layers which are adjacent to each other in the depth direction may have a flat portion in which the carrier concentration is substantially constant in the depth direction.

In the semiconductor device according to the above-mentioned aspect of the invention, in the carrier concentration distribution of the n-type buffer layer, a width from the position of the peak carrier concentration to the p-type layer may be more than a width from the position of the peak carrier concentration to the second main surface of the n-type semiconductor substrate.

In the semiconductor device according to the above-mentioned aspect of the invention, the carrier concentration of the region interposed between the n-type buffer layers which are adjacent to each other in the depth direction may be reduced toward the p-type layer.

In the semiconductor device according to the above-mentioned aspect of the invention, when a thickness of the n-type semiconductor substrate from the first main surface to the second main surface is $W_0$, a depth of the p-type layer from the first main surface of the n-type semiconductor substrate is xj, a distance from an interface between the p-type layer and the n-type drift layer to the closest buffer layer is Z, and a depth from the second main surface of the n-type semiconductor substrate to the position of the peak carrier concentration of the closest buffer layer is Y, the depth Y from the second main surface of the n-type semiconductor substrate to the position of the peak carrier concentration of the closest buffer layer may be $Y=W_0-(Z+xj)$. When the distance Z from the interface between the p-type layer and the n-type drift layer to the closest buffer layer is $Z=aW_0$, a coefficient α may be equal to or greater than 0.4 and equal to or less than 0.8.

In the semiconductor device according to the above-mentioned aspect of the invention, the coefficient α may be equal to or greater than 0.45 and equal to or less than 0.7. In the semiconductor device according to the above-mentioned aspect of the invention, the coefficient α may be equal to or greater than 0.5 and equal to or less than 0.6.

In the semiconductor device according to the above-mentioned aspect of the invention, when a permittivity of silicon is $e_S$, a rated voltage is $V_{rate}$, rated current density is $J_{rate}$, an elementary charge is q, a saturation speed of a carrier is $v_{sat}$, a doping concentration of the n-type drift layer is Nd, a depth of the p-type layer from the first main surface of the n-type semiconductor substrate is xj, a distance from an interface between the p-type layer and the n-type drift layer to the closest buffer layer is Z, and a depth from the second main surface of the n-type semiconductor substrate to the position of the peak carrier concentration of the closest buffer layer is Y, a distance index $x_0$ may be represented by the following Equation (1). The depth Y from the second main surface of the n-type semiconductor substrate to the position of the peak carrier concentration of the closest buffer layer may be $Y=W_0-(Z+xj)$. When the distance Z from the interface between the p-type layer and the n-type drift layer to the closest buffer layer is $Z=\beta x_0$, a coefficient β may be equal to or greater than 0.6 and equal to or less than 1.4.

Equation 1

$$x_0 = \sqrt{\frac{\varepsilon_S V_{rate}}{\left(\frac{J_{rate}}{qv_{sat}} + N_d\right)}} \quad (1)$$

In the semiconductor device according to the above-mentioned aspect of the invention, the coefficient β may be equal to or greater than 0.7 and equal to or less than 1.2. In the semiconductor device according to the above-mentioned aspect of the invention, the coefficient β may be equal to or greater than 0.8 and equal to or less than 1.0.

In the semiconductor device according to the above-mentioned aspect of the invention, the semiconductor device may be a pn diode that includes the p-type layer as a p-type anode layer and the n-type layer as the n-type buffer layer and an n-type cathode layer, or an insulated gate bipolar transistor that includes the p-type layer as a p-type well layer, an n-type emitter layer which is selectively provided in the p-type well layer, and a p-type collector layer which is provided in a surface layer of the n-type layer opposite to the n-type drift layer.

In order to solve the above-mentioned problems, a method for manufacturing a semiconductor device according to another aspect of the invention has the following characteristics. First, a first step of forming a p-type layer and a main electrode which comes into contact with the p-type layer in a surface layer of a first main surface of an n-type semiconductor substrate is performed. Then, a second step of implanting a proton into a second main surface of the n-type semiconductor substrate at different acceleration energy levels a plurality of times is performed.

Then, a third step of performing a heat treatment on the proton implanted by the proton implantation to change the proton into a donor so as to form a plurality of n-type buffer layers at different depths from the second main surface of the n-type semiconductor substrate is performed. In the second step, the proton implantation is performed such that the position of the peak carrier concentration of the closest buffer layer which is formed at a position closest to the p-type layer among the plurality of n-type buffer layers formed in the third step is spaced 15 μm farther away from the second main surface of the n-type semiconductor substrate.

In the method for manufacturing a semiconductor device according to the above-mentioned aspect of the invention, the acceleration energy of the proton implantation for forming the closest buffer layer may be equal to or more than 1.0 MeV and equal to or less than 8 MeV.

In the method for manufacturing a semiconductor device according to the above-mentioned aspect of the invention, when a permittivity of silicon is $e_S$, a rated voltage is $V_{rate}$, a rated current density is $J_{rate}$, an elementary charge is q, a saturation speed of a carrier is $v_{sat}$, a doping concentration of an n-type drift layer, which is the n-type semiconductor substrate, is Nd, a depth of the p-type layer from the first main surface of the n-type semiconductor substrate is xj, a distance from an interface between the p-type layer and the n-type drift layer to the closest buffer layer is Z, and a depth from the second main surface of the n-type semiconductor substrate to the position of the peak carrier concentration of the closest buffer layer is Y, a distance index $x_0$ may be represented by the following Equation (2). The depth Y from the second main surface of the n-type semiconductor substrate to the position of the peak carrier concentration of the closest buffer layer may be $Y=W_0-(Z+xj)$. The distance Z from the interface between the p-type layer and the n-type drift layer to the closest buffer layer may be $Z=\beta x_0$. The acceleration energy of the proton implantation for forming the closest buffer layer may be set so as to correspond to the value of the coefficient β.

Equation 2

$$x_0 = \sqrt{\frac{\varepsilon_S V_{rate}}{\left(\frac{J_{rate}}{qv_{sat}} + N_d\right)}} \quad (2)$$

In the method for manufacturing a semiconductor device according to the above-mentioned aspect of the invention, the rated voltage may be 600 V and the acceleration energy of the proton implantation for forming the closest buffer layer may be equal to or more than 1.1 MeV and equal to or less than 1.8 MeV.

In the method for manufacturing a semiconductor device according to the above-mentioned aspect of the invention, the rated voltage may be 1200 V and the acceleration energy of the proton implantation for forming the closest buffer layer may be equal to or more than 1.6 MeV and equal to or less than 2.8 MeV.

In the method for manufacturing a semiconductor device according to the above-mentioned aspect of the invention, the rated voltage may be 1700 V and the acceleration energy of the proton implantation for forming the closest buffer layer may be equal to or more than 1.9 MeV and equal to or less than 3.4 MeV.

In the method for manufacturing a semiconductor device according to the above-mentioned aspect of the invention, the rated voltage may be 3300 V and the acceleration energy of the proton implantation for forming the closest buffer layer may be equal to or more than 3.0 MeV and equal to or less than 5.1 MeV.

In the method for manufacturing a semiconductor device according to the above-mentioned aspect of the invention, the rated voltage may be 4500 V and the acceleration energy of the proton implantation for forming the closest buffer layer may be equal to or more than 3.7 MeV and equal to or less than 6.1 MeV.

In the method for manufacturing a semiconductor device according to the above-mentioned aspect of the invention, the rated voltage may be 6500 V and the acceleration energy of the proton implantation for forming the closest buffer layer may be equal to or more than 4.7 MeV and equal to or less than 7.6 MeV.

In the method for manufacturing a semiconductor device according to the above-mentioned aspect of the invention, in the third step, the heat treatment may be performed at a temperature of 400° C. to 500° C. for 1 hour to 10 hours.

In the method for manufacturing a semiconductor device according to the above-mentioned aspect of the invention, in the third step, the heat treatment may be performed at a temperature of 420° C. to 450° C. for 1 hour to 3 hours.

In the method for manufacturing a semiconductor device according to the above-mentioned aspect of the invention, when a common logarithm log(E) of the acceleration energy E of the proton implantation for forming the closest buffer layer is y and a common logarithm log(Rp) of a range Rp of the proton implantation for forming the closest buffer layer from the second main surface of the n-type semiconductor substrate is x, $y=-0.0047x^4+0.0528x^3-0.2211x^2+0.9923x+5.0474$ may be satisfied.

According to another aspect of the invention, a diode includes an n-type drift layer provided in an n-type semiconductor substrate, a p-type anode layer provided in a first main surface of the semiconductor substrate, an n-type cathode layer provided in a second main surface of the semiconductor substrate, and a plurality of n-type buffer layers provided between the drift layer and the cathode layer, the buffer layers including hydrogen as a donor. The buffer layers include a shallowest buffer layer formed on a further inner side of the semiconductor substrate than the cathode layer, an intermediate buffer layer formed on a further inner side of the semiconductor substrate than the shallowest buffer layer, and a deepest buffer layer formed in a position deeper than 15 μm from the second main surface of the semiconductor substrate and on a further inner side of the semiconductor substrate than the intermediate buffer layer. A distribution of a carrier concentration of the semiconductor substrate has a peak and a tail, of which the carrier concentration is lower than that of the peak, in each of the shallowest buffer layer, the intermediate buffer layer and the deepest buffer layer. The tail of the shallowest buffer layer is in contact with the cathode layer. The distribution has a flat portion, at which the carrier concentration is substantially constant, between the tail of the shallowest buffer layer and the tail of the intermediate buffer layer. A length of the flat portion is longer than a length from the second main surface of the semiconductor substrate to the peak of the shallowest buffer layer. The carrier concentration between the second main surface of the semiconductor substrate and the deepest buffer layer is higher than the carrier concentration of the drift layer.

In the diode according to the above-mentioned aspect of the invention, the flat portion comprises a position of 10 μm from the second main surface of the semiconductor substrate.

In the diode according to the above-mentioned aspect of the invention, the flat portion is a region in which the carrier concentration varies within a range of ±20%.

In the diode according to the above-mentioned aspect of the invention, in each of the buffer layers, the tail is a region between the peak and a point at which a gradient is substantially zero (0).

In the diode according to the above-mentioned aspect of the invention, the flat portion connects the tail of the shallowest buffer layer and the tail of the intermediate buffer layer.

In the diode according to the above-mentioned aspect of the invention, the peak of the shallowest buffer layer is greater than the peak of the intermediate buffer layer, and greater than the peak of the deepest buffer layer, the peak of the intermediate buffer layer and the peak of the deepest buffer layer are substantially the same.

In the diode according to the above-mentioned aspect of the invention, the intermediate buffer layer is provided in plural.

In the diode according to the above-mentioned aspect of the invention, the carrier concentration between the second main surface of the semiconductor substrate and the peak of the deepest buffer layer is equal to or higher than $1\times10^{14}/cm^3$.

In the diode according to the above-mentioned aspect of the invention, the drift layer is provided between the deepest buffer layer and the anode layer.

According to another aspect of the invention, a diode includes an n-type drift layer provided in an n-type semiconductor substrate, a p-type anode layer provided in a first main surface of the semiconductor substrate, an n-type cathode layer provided in a second main surface of the semiconductor substrate, and a plurality of n-type buffer layers provided between the drift layer and the cathode layer, the buffer layers including hydrogen as a donor. The buffer layers include a shallowest buffer layer formed on a further inner side of the semiconductor substrate than the cathode layer, an intermediate buffer layer formed on a further inner side of the semiconductor substrate than the shallowest buffer layer, and a deepest buffer layer formed in a position deeper than 15 μm from the second main surface of the semiconductor substrate and on a further inner side of the semiconductor substrate than the intermediate buffer layer. A distribution of a carrier concentration of the semiconductor substrate has a peak and a tail, of which the carrier concentration is lower than that of the peak, in each of the shallowest buffer layer, the intermediate buffer layer and the deepest buffer layer. The tail of the shallowest buffer layer is in contact with the cathode layer. The distribution has a flat portion, at which the carrier concentration is substantially constant, between the tail of the shallowest buffer layer and the tail of the intermediate buffer layer. A length of the flat portion is equal to or greater than 0.3 times of a length LAB between the peak of the shallowest buffer layer and the peak of the intermediate buffer layer. The carrier concentration between the second main surface of the semiconductor substrate and the deepest buffer layer is higher than the carrier concentration of the drift layer.

In the diode according to the above-mentioned aspect of the invention, the length of the flat portion is equal to or less than 0.7 times of the length LAB between the peak of the shallowest buffer layer and the peak of the intermediate buffer layer.

In the diode according to the above-mentioned aspect of the invention, the flat portion comprises a position of 10 μm from the second main surface of the semiconductor substrate.

In the diode according to the above-mentioned aspect of the invention, the flat portion is a region in which the carrier concentration varies within a range of ±20%.

In the diode according to the above-mentioned aspect of the invention, in each of the buffer layers, the tail is a region between the peak and a point at which a gradient is substantially zero (0).

In the diode according to the above-mentioned aspect of the invention, the length of the flat portion is longer than a length from the second main surface of the semiconductor substrate to the peak of the shallowest buffer layer.

In the diode according to the above-mentioned aspect of the invention, the flat portion connects the tail of the shallowest buffer layer and the tail of the intermediate buffer layer.

In the diode according to the above-mentioned aspect of the invention, the peak of the shallowest buffer layer is greater than the peak of the intermediate buffer layer, and greater than the peak of the deepest buffer layer, and the peak of the intermediate buffer layer and the peak of the deepest buffer layer are substantially the same.

In the diode according to the above-mentioned aspect of the invention, the intermediate buffer layer is provided in plural.

In the diode according to the above-mentioned aspect of the invention, the carrier concentration between the second main surface of the semiconductor substrate and the peak of the deepest buffer layer is equal to or higher than $1\times10^{14}/cm^3$.

In the diode according to the above-mentioned aspect of the invention, the drift layer is provided between the deepest buffer layer and the anode layer.

In the diode according to the above-mentioned aspect of the invention, the carrier concentration of the flat portion is higher than the carrier concentration of the drift layer.

Another aspect of the invention relates to a method for manufacturing a diode having an n-type drift layer provided in an n-type semiconductor substrate, a p-type anode layer provided in a first main surface of the semiconductor substrate, an n-type cathode layer provided in a second main surface of the semiconductor substrate, and a plurality of n-type buffer layers provided between the drift layer and the cathode layer, the buffer layers including hydrogen as a donor. The method includes a buffer layer forming process of forming, as the buffer layers, a shallowest buffer layer formed on a further inner side of the semiconductor substrate than the cathode layer, an intermediate buffer layer formed on a further inner side of the semiconductor substrate than the shallowest buffer layer, and a deepest buffer layer formed in a position deeper than 15 μm from the second main surface of the semiconductor substrate and on a further inner side of the semiconductor substrate than the intermediate buffer layer, by implanting hydrogen and performing annealing, such that: a distribution of a carrier concentration of the semiconductor substrate has a peak and a tail, of which the carrier concentration is lower than that of the peak, in each of the shallowest buffer layer, the intermediate buffer layer and the deepest buffer layer; the tail of the shallowest buffer layer is in contact with the cathode layer; the distribution has a flat portion, at which the carrier concentration is substantially constant, between the tail of the shallowest buffer layer and the tail of the intermediate buffer layer; a length of the flat portion is longer than a length from the second main surface of the semiconductor substrate to the peak of the shallowest buffer layer; and the carrier concentration between the second main surface of the semiconductor substrate and the deepest buffer layer is higher than the carrier concentration of the drift layer.

In the method according to the above-mentioned aspect of the invention, the flat portion is a region in which the carrier concentration varies within a range of ±20%.

In the method according to the above-mentioned aspect of the invention, in each of the buffer layers, the tail is a region between the peak and a point at which a gradient is substantially zero (0).

In the method according to the above-mentioned aspect of the invention, the flat portion connects the tail of the shallowest buffer layer and the tail of the intermediate buffer layer.

In the method according to the above-mentioned aspect of the invention, the peak of the shallowest buffer layer is greater than the peak of the intermediate buffer layer, and greater than the peak of the deepest buffer layer, and the peak of the intermediate buffer layer and the peak of the deepest buffer layer are substantially the same.

In the method according to the above-mentioned aspect of the invention, in the buffer layer forming process, the intermediate buffer layer is formed in plural.

The method according to the above-mentioned aspect of the invention, the drift layer is provided between the deepest buffer layer and the anode layer.

Yet another aspect of the invention relates to a method for manufacturing a diode comprising an n-type drift layer provided in an n-type semiconductor substrate, a p-type anode layer provided in a first main surface of the semiconductor substrate, an n-type cathode layer provided in a second main surface of the semiconductor substrate, and a plurality of n-type buffer layers provided between the drift layer and the cathode layer, the buffer layers including hydrogen as a donor. The method includes a buffer layer forming process of forming, as the buffer layers, a shallowest buffer layer formed on a further inner side of the semiconductor substrate than the cathode layer, an intermediate buffer layer formed on a further inner side of the semiconductor substrate than the shallowest buffer layer, and a deepest buffer layer formed in a position deeper than 15 μm from the second main surface of the semiconductor substrate and on a further inner side of the semiconductor substrate than the intermediate buffer layer, by implanting hydrogen and performing annealing, such that: a distribution of a carrier concentration of the semiconductor substrate has a peak and a tail, of which the carrier concentration is lower than that of the peak, in each of the shallowest buffer layer, the intermediate buffer layer and the deepest buffer layer; the tail of the shallowest buffer layer is in contact with the cathode layer; the distribution has a flat portion, at which the carrier concentration is substantially constant, between the tail of the shallowest buffer layer and the tail of the intermediate buffer layer; a length of the flat portion is equal to or greater than 0.3 times of a length LAB between the peak of the shallowest buffer layer and the peak of the intermediate buffer layer; and the carrier concentration between the second main surface of the semiconductor substrate and the deepest buffer layer is higher than the carrier concentration of the drift layer.

In the method according to the above-mentioned aspect of the invention, the length of the flat portion is equal to or less than 0.7 times of the length $L_{AB}$ between the peak of the shallowest buffer layer and the peak of the intermediate buffer layer.

In the method according to the above-mentioned aspect of the invention, the flat portion is a region in which the carrier concentration varies within a range of ±20%.

In the method according to the above-mentioned aspect of the invention, in each of the buffer layers, the tail is a region between the peak and a point at which a gradient is substantially zero (0).

In the method according to the above-mentioned aspect of the invention, the length of the flat portion is longer than a length from the second main surface of the semiconductor substrate to the peak of the shallowest buffer layer.

In the method according to the above-mentioned aspect of the invention, the flat portion connects the tail of the shallowest buffer layer and the tail of the intermediate buffer layer.

In the method according to the above-mentioned aspect of the invention, the peak of the shallowest buffer layer is greater than the peak of the intermediate buffer layer, and greater than the peak of the deepest buffer layer, and the peak of the intermediate buffer layer and the peak of the deepest buffer layer are substantially the same.

In the method according to the above-mentioned aspect of the invention, in the buffer layer forming process, the intermediate buffer layer is formed in plural.

According to the semiconductor device and the semiconductor device manufacturing method of the invention, it is possible to suppress the spreading of a depletion layer, to ensure a breakdown voltage, to reduce generation loss, and to suppress the oscillation of voltage and current during a switching operation. In addition, according to the semiconductor device and the semiconductor device manufacturing method of the invention, it is possible to recover a crystal defect to reduce a leakage current and to reduce the risk of thermal runaway due to a high-temperature operation.

BRIEF DESCRIPTION OF THE DRAWINGS

The foregoing advantages and features of the invention will become apparent upon reference to the following detailed description and the accompanying drawings, of which:

FIG. 15 is a table illustrating a distance Y from a rear surface of a substrate to the peak position of the deepest n-type buffer layer 5 at each rated voltage.

DETAILED DESCRIPTION OF SPECIFIC EMBODIMENTS

Figure 1A:
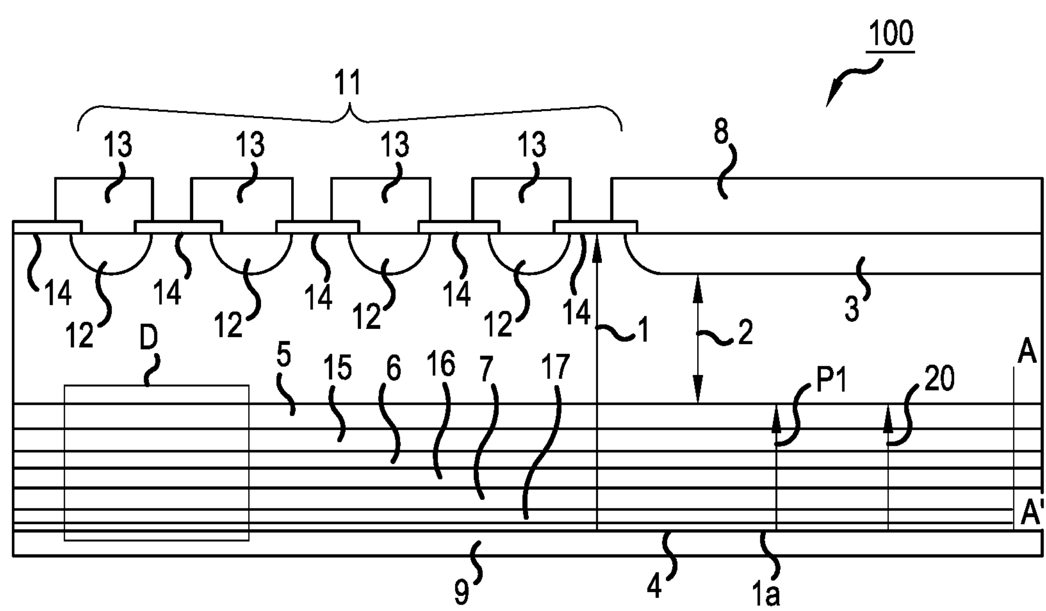
FIGS. 1A and 1B are cross-sectional views illustrating the structure of a semiconductor device according to Example 1 of the invention.

Hereinafter, a semiconductor device and a method for manufacturing the same according to exemplary embodiments of the invention will be described in detail with reference to the accompanying drawings. In the specification and the accompanying drawings, in the layers or regions having "n" or "p" appended thereto, an electron or a hole means a majority carrier. In the description of the following embodiments and the accompanying drawings, the same components are denoted by the same reference numerals and the description thereof will not be repeated. The embodiments are represented by the following examples.

Example 1

Figure 1B:
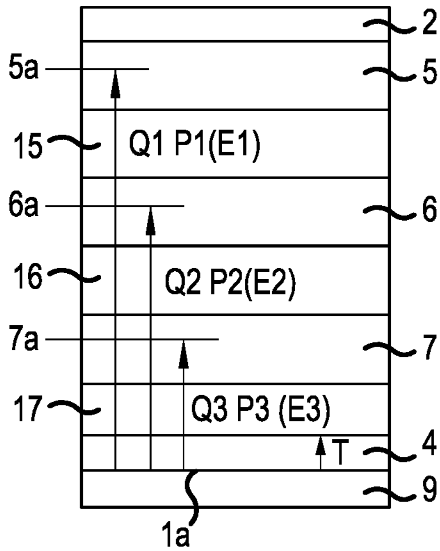

The structure of a semiconductor device according to Example 1 will be described. FIGS. 1A and 1B are cross-sectional views illustrating the structure of the semiconductor device according to Example 1 of the invention. FIG. 1A is a cross-sectional view illustrating a main portion and FIG. 1B is an enlarged view illustrating a portion D. FIG. 1B illustrates the depth of n-type buffer layers 5, 6, and 7. A PiN diode 100 is given as an example of the semiconductor device according to Example 1 illustrated in FIGS. 1A and 1B. The PiN diode 100 has a breakdown voltage of 1200 V. The following carrier concentration is calculated from spreading resistance (SR).

The PiN diode 100 includes a p-type anode layer 3 that is provided in a surface layer of a first main surface (front surface) of an n-type silicon substrate 1 with a thickness of about 120 μm and an n-type cathode layer 4 which is provided in a second main surface (rear surface). Three n-type buffer layers 5, 6, and 7 are provided in the n-type silicon substrate 1 at different depths from the n-type cathode layer 4 to the p-type anode layer 3. The impurity concentration of the n-type buffer layers 5, 6, and 7 is more than that of the n-type silicon substrate 1. An anode electrode 8 which is connected to the p-type anode layer 3 is provided on the front surface of the n-type silicon substrate 1. A cathode electrode 9 which is connected to the n-type cathode layer 4 is provided on a rear surface 1*a* of the n-type silicon substrate 1.

A high-breakdown-voltage junction termination structure 11 is provided outside the p-type anode layer 3 in a direction horizontal to the main surface of the substrate so as to surround an active region in which the p-type anode layer 3 is provided. The high-breakdown-voltage junction termination structure 11 includes a plurality of ring-shaped p-type layers 12 which surround the p-type anode layer 3, termination electrodes 13 which are provided on the p-type layers 12, and an insulating film 14 which is, for example, an oxide film and separates the p-type anode layer 3 from each p-type layer 12.

Among the three n-type buffer layers 5, 6, and 7, the n-type buffer layer (hereinafter, referred to as the deepest n-type buffer layer) 5 which is arranged at the deepest position from the rear surface 1*a* of the n-type silicon substrate 1 is formed in the vicinity of the middle between the p-type anode layer 3 and the n-type cathode layer 4. Specifically, a peak carrier concentration position 5*a* of the deepest n-type buffer layer 5 is disposed at a depth P1 from the interface (the rear surface 1*a* of the n-type silicon substrate 1) between the n-type cathode layer 4 and the cathode electrode 9 and the depth P1 is about 60 μm from the interface between the n-type cathode layer 4 and the cathode electrode 9.

The anode electrode 8 and the cathode electrode 9 are metal electrodes. A region of the n-type silicon substrate 1 between the p-type anode layer 3 and the deepest n-type buffer layer 5 is an n-type drift layer 2. A region interposed between the n-type buffer layers 5 and 6 which are adjacent to each other in the depth direction is a carrier storage region 15 and a region interposed between the n-type buffer layers 6 and 7 which are adjacent to each other in the depth direction is a carrier storage region 16. The entire region, including the carrier storage regions 15 and 16, a region 17 which is interposed between the n-type cathode layer 4 and the n-type buffer layer (hereinafter, referred to as the shallowest n-type buffer layer) 7 that is arranged at the shallowest position from the rear surface 1*a* of the n-type silicon substrate 1, and the n-type cathode layer 4 is an n-type layer 20. The n-type layer 20 is a region in which protons, which are hydrogen (H) ions (proton) implanted in different ranges from the rear surface of the n-type silicon substrate 1, are changed into donors (hydrogen-related donors).

Figure 2:
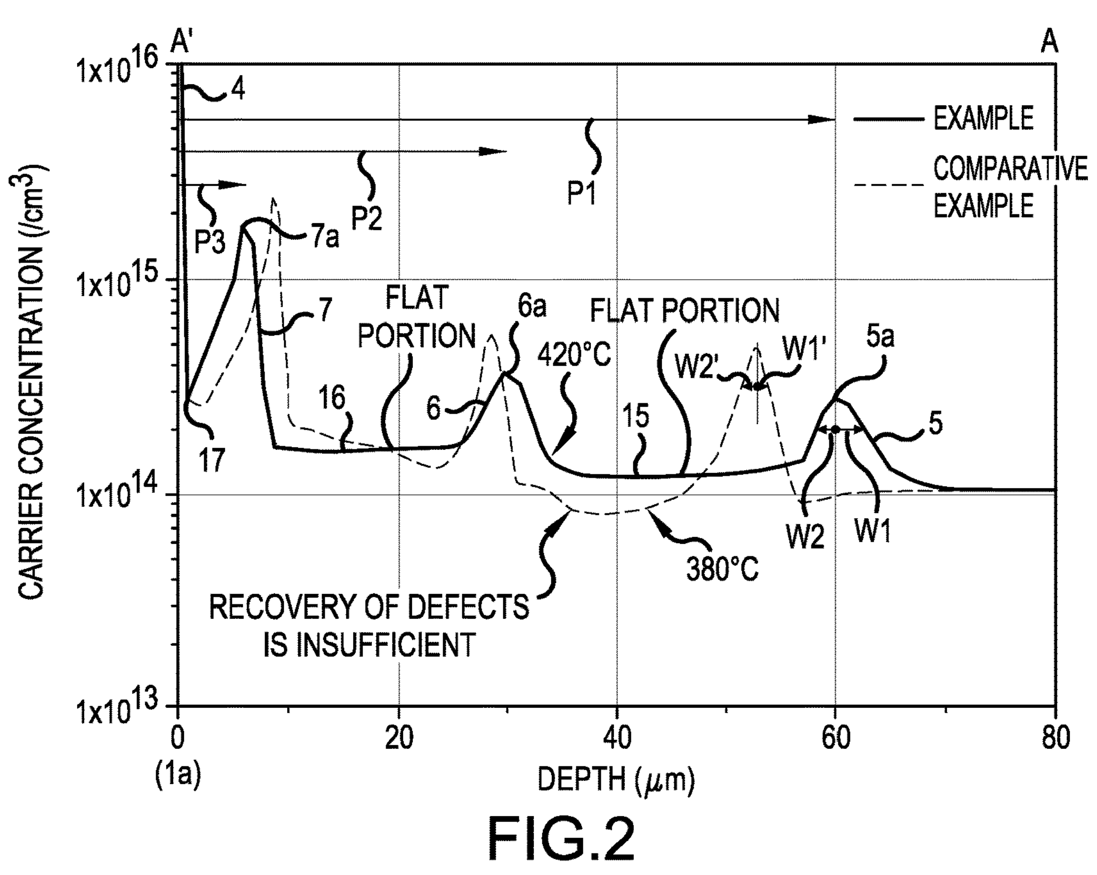
FIG. 2 is a characteristic diagram illustrating a carrier concentration distribution along the cutting line A-A' of FIG. 1A.

Next, the carrier concentration distribution of the n-type buffer layers 5, 6, and 7 in the PiN diode 100 will be described. FIG. 2 is a characteristic diagram illustrating the carrier concentration distribution along the line A-A' of FIG. 1A. FIG. 2 illustrates the carrier concentration distribution of the PiN diode 100 in which the three n-type buffer layers 5, 6, and 7 are formed in the n-type silicon substrate 1. In FIG. 2, the horizontal axis is the depth from the rear surface 1*a* of the n-type silicon substrate 1 and "0" on the horizontal axis indicates the rear surface 1*a* of the n-type silicon substrate 1. The diffusion depth T of the n-type cathode layer 4 is about 1 μm (see FIG. 1B for reference numerals T, E1, E2, E3, Q1, Q2, and Q3).

The three n-type buffer layers 5, 6, and 7 are formed in the n-type silicon substrate 1, for example, under the following conditions. A proton implantation dose is, for example, about $1\times10^{13}/cm_2$ to $2\times10^{13}/cm_2$. Acceleration energy levels (E1, E2, and E3) are, for example, 2.3 MeV, 1.5 MeV, and 0.5 MeV. Ranges (P1, P2, and P3) corresponding to the acceleration energy levels (E1, E2, and E3) are 60 μm, 30 μm, and 6 μm, respectively. A heat treatment is performed at a temperature of 420° C. for 3 hours. In a comparative example represented by a dotted line, the heat treatment temperature was 380° C. In the comparative example, the conditions are the same as those in Example 1 except for the heat treatment temperature.

The depths (Q1, Q2, and Q3) of the n-type buffer layers 5, 6, and 7 from the rear surface 1*a* (the position of 0 on the horizontal axis in FIG. 2) of the n-type silicon substrate 1 which are represented by the peak carrier concentration positions (5*a*, 6*a*, and 7*a*) of the n-type buffer layers 5, 6, and 7 are 60 μm, 25 μm, and 6 μm, respectively. The depths are equal to proton implantation ranges (P1, P2, and P3). The proton implantation range means the distance from an implantation surface (the rear surface 1*a* of the n-type silicon substrate 1) to the position (the peak position of a proton distribution) with a peak proton implantation amount. The proton is spread to the front and rear sides of the range (to the anode side and the cathode side in the depth direction). As the range becomes long, the extension area of the proton is widened.

In the carrier concentration distribution of the deepest n-type buffer layer 5, a first width W1 from the peak carrier concentration position 5*a* of the deepest n-type buffer layer 5 to the anode is more than a second width W2 from the peak carrier concentration position 5*a* to the cathode (the rear surface 1*a* of the n-type silicon substrate 1) opposite to the anode (which is reversed in the comparative example). The width of the deepest n-type buffer layer 5 may be the half-width at half-maximum (HWHM) of the peak carrier concentration of the deepest n-type buffer layer 5 or the width of 1/e (e is the base of natural logarithm or a Napier's constant and is about 2.71828) of the peak carrier concentration. It is supposed that the first width W1 is more than the second width W2 because damage by proton implantation and a defect caused by the damage are smaller on the front side (anode side) of the range than on the rear side (cathode side) thereof and many defects remain on the rear side (cathode side) of the range, resulting in a reduction in carrier concentration. A depletion layer which is spread from a pn junction between the p-type anode layer 3 and the n-type drift layer 2 reaches the deepest n-type buffer layer 5 first. In this case, when the first width W1 is more than the second width W2, the gradient of the carrier concentration is gentle on the anode side in the carrier concentration distribution of the deepest n-type buffer layer 5. Then, the spreading of the depletion layer in the region is reduced and an increase in the rate of change of voltage dV/dt is small. When the rate of change of voltage dV/dt increases sharply, voltage oscillation occurs. However, since the increase in the rate of change of voltage dV/dt is small, it is possible to suppress the voltage oscillation. On the other hand, when the first width W1 is less than the second width W2, the spreading of the depletion layer is suddenly stopped at the peak carrier concentration position 5*a* of the deepest n-type buffer layer 5. Therefore, voltage oscillation is likely to occur.

Figure 16A:
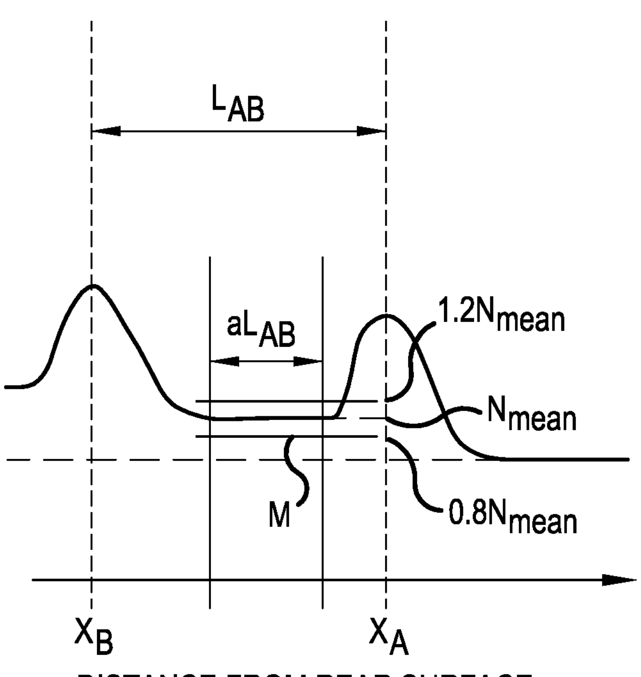
FIGS. 16A and 16B are characteristic diagrams schematically illustrating a carrier concentration distribution with respect to the distance from the rear surface.
Figure 16B:
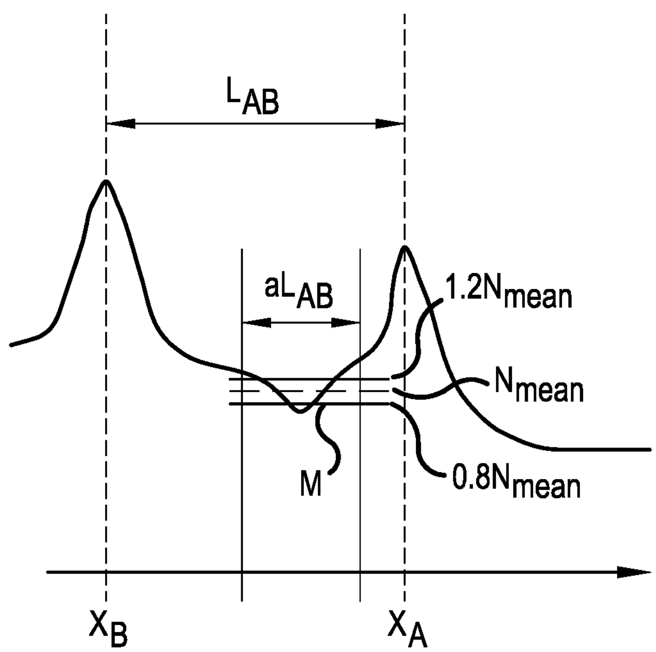

The carrier concentration distributions of the regions (carrier storage regions) 15 and 16 interposed between the n-type buffer layers 5, 6, and 7 which are adjacent to each other in the depth direction are flat (impurity concentration is uniform in the depth direction). Herein "flat (impurity concentration is uniform in the depth direction)" may be satisfied when the following is established. FIGS. 16A and 16B are characteristic diagrams schematically illustrating a carrier concentration distribution with respect to the distance from the rear surface. The scale of the vertical axis is a common logarithm. In FIG. 16A, it is assumed that an n-type buffer layer A (for example, the n-type buffer layer 5) is provided at a given depth and an n-type buffer layer B (for example, the n-type buffer layer 6) is provided closer to the rear surface of the substrate than the n-type buffer layer A. In addition, it is assumed that the distance between positions (peak positions) $X_A$ and $X_B$ where the n-type buffer layer A and the n-type buffer layer B have the maximum carrier concentration is $L_{AB}$. It is considered that a region M with a length (length in the depth direction) of $aL_{AB}$ is provided between $X_A$ and $X_B$. Herein "a" is a non-dimensional coefficient and is greater than 0 and less than 1, particularly, equal to or greater than 0.3 and equal to or less than 0.7. That is, the length $aL_{AB}$ of the region M is in the range of 30% to 70% of the distance $L_{AB}$ between $X_A$ and $X_B$. In the example illustrated in FIGS. 16A and 16B, for example, the coefficient "a" is 0.4 (the length $aL_{AB}$ of the region M is 40% of the distance $L_{AB}$ between $X_A$ and $X_B$). In addition, it is assumed that the region M includes the position where carrier concentration is the minimum between XA and XB. For example, the position where carrier concentration is the minimum may be the center of the region M or it may deviate from the center of the region M.

The region M is used to define the term "flat (impurity concentration is uniform in the depth direction)" as follows. When the carrier concentration distribution of the region M is in the range of ±20% of the average carrier concentration $N_{mean}$ of the region M, that is, in the range of 0.8 $N_{mean}$ to 1.2 $N_{mean}$, the carrier concentration between the n-type buffer layer A and the n-type buffer layer B is "flat (impurity concentration is uniform in the depth direction)". The average carrier concentration $N_{mean}$ of the region M is obtained by integrating the carrier concentration in the depth direction in the range of the region M to calculate integrated concentration and dividing the integrated concentration by the length $aL_{AB}$ of the region M. That is, preferably, the carrier concentration of the region M is in the range of ±20% of the average carrier concentration $N_{mean}$ of the region M and the region M includes the position where the carrier concentration is the minimum between $X_A$ and $X_B$. In FIG. 16A, the carrier concentration between the n-type buffer layer A and the n-type buffer layer B is flat. In contrast, in FIG. 16B, the region M includes the position where the carrier concentration is the minimum, but the minimum carrier concentration and the carrier concentration at both ends of the region M are beyond the range of ±20% of the average carrier concentration $N_{mean}$ of the region M. Therefore, in the example illustrated in FIG. 16B, the carrier concentration between the n-type buffer layer A and the n-type buffer layer B is not flat.

Carriers are stored in the carrier storage regions 15 and 16 when the diode is turned on. It is preferable that the doping concentration of the carrier storage regions 15 and 16 be flat, similarly to the doping concentration distribution of the n-type silicon substrate 1. In addition, the carrier concentration of the carrier storage regions 15 and 16 is less than the peak carrier concentration of the n-type buffer layers 5, 6, and 7 and is, for example, equal to or more than the carrier concentration of the n-type silicon substrate 1 and equal to or less than five times the carrier concentration of the n-type silicon substrate 1. When the carrier concentration of the carrier storage regions 15 and 16 is set to the above-mentioned range, it is possible to increase the remaining number of stored carriers.

In contrast, when the carrier concentration of the carrier storage regions 15 and 16 is less than the carrier concentration of the n-type silicon substrate 1 and is more than five times the carrier concentration of the n-type silicon substrate 1, the following problems occur, which is not preferable. The carrier concentration of the carrier storage regions 15 and 16 which is less than the carrier concentration of the n-type silicon substrate 1 means that the carrier concentration of the carrier storage regions 15 and 16 is not flat and crystal defects are not sufficiently recovered. Therefore, when a reverse bias is applied and the depletion layer which is spread from the pn junction between the p-type anode layer 3 and the n-type drift layer 2 reaches the carrier storage regions 15 and 16, carriers are generated around the residual defects in the carrier storage regions 15 and 16, which results in an increase in leakage current. When the diode is turned on and when the reverse recovery is applied, carriers are recombined around the residual defects in the carrier storage regions 15 and 16. As a result, the carriers are reduced and depleted.

When the carrier concentration of the carrier storage regions 15 and 16 is more than five times the carrier concentration of the n-type silicon substrate 1, net doping concentration is too high due to the donors, neutral conditions are satisfied by electrons and donor ions, and the number of holes is significantly reduced. As a result, the holes are quickly depleted and the voltage and current oscillate during reverse recovery, which causes radiation noise.

For this reason, the carrier concentration of the carrier storage regions 15 and 16 is set to be equal to or more than the carrier concentration of the n-type silicon substrate 1 and equal to or less than five times the carrier concentration of the n-type silicon substrate 1 and the carrier concentration distribution is flat, which makes it possible to delay the depletion of the holes. As a result, it is possible to suppress the oscillation of voltage and current during reverse recovery and thus suppress the generation of radiation noise.

It is preferable that the carrier concentration of the carrier storage regions 15 and 16 interposed between the n-type buffer layers 5, 6, and 7 which are adjacent to each other in the depth direction increase toward the n-type cathode layer 4. That is, the carrier concentration of the carrier storage region 16 interposed between the shallowest n-type buffer layer 7 and the n-type buffer layer (hereinafter, referred to as an intermediate-depth n-type buffer layer) 6 arranged at an intermediate position between the n-type buffer layer 5 and the n-type buffer layer 7 is more than the carrier concentration of the carrier storage region 15 interposed between the deepest n-type buffer layer 5 and the intermediate-depth n-type buffer layer 6 (the carrier concentration of the carrier storage region 16>the carrier concentration of the carrier storage region 15). According to this carrier concentration distribution, the expansion of the depletion layer, which is spread from the pn junction between the p-type anode layer 3 and the n-type drift layer 2, to the cathode is slowly suppressed and the depletion of the holes is delayed. Therefore, the oscillation of voltage and current during reverse recovery is suppressed. As a result, it is possible to suppress the generation of radiation noise.

When the carrier concentration of the carrier storage regions 15 and 16 interposed between the n-type buffer layers 5, 6, and 7 is more than that of the n-type silicon substrate 1, the spreading of the depletion layer from the pn junction between the p-type anode layer 3 and the n-type drift layer 2 is suppressed. Therefore, even when the n-type silicon substrate 1 has a small thickness, it is possible to ensure a breakdown voltage and to reduce generation loss. In addition, the carrier concentration of the carrier storage regions 15 and 16 interposed between the n-type buffer layers 5, 6, and 7 which is more than that of the n-type silicon substrate 1 proves that crystal defects in the carrier storage regions 15 and 16 are sufficiently recovered. Therefore, it is possible to reduce a leakage current.

In the PiN diode 100 having the above-mentioned structure, good soft recovery characteristics are obtained and it is possible to reduce a surge voltage and radiation noise.

Figure 3:
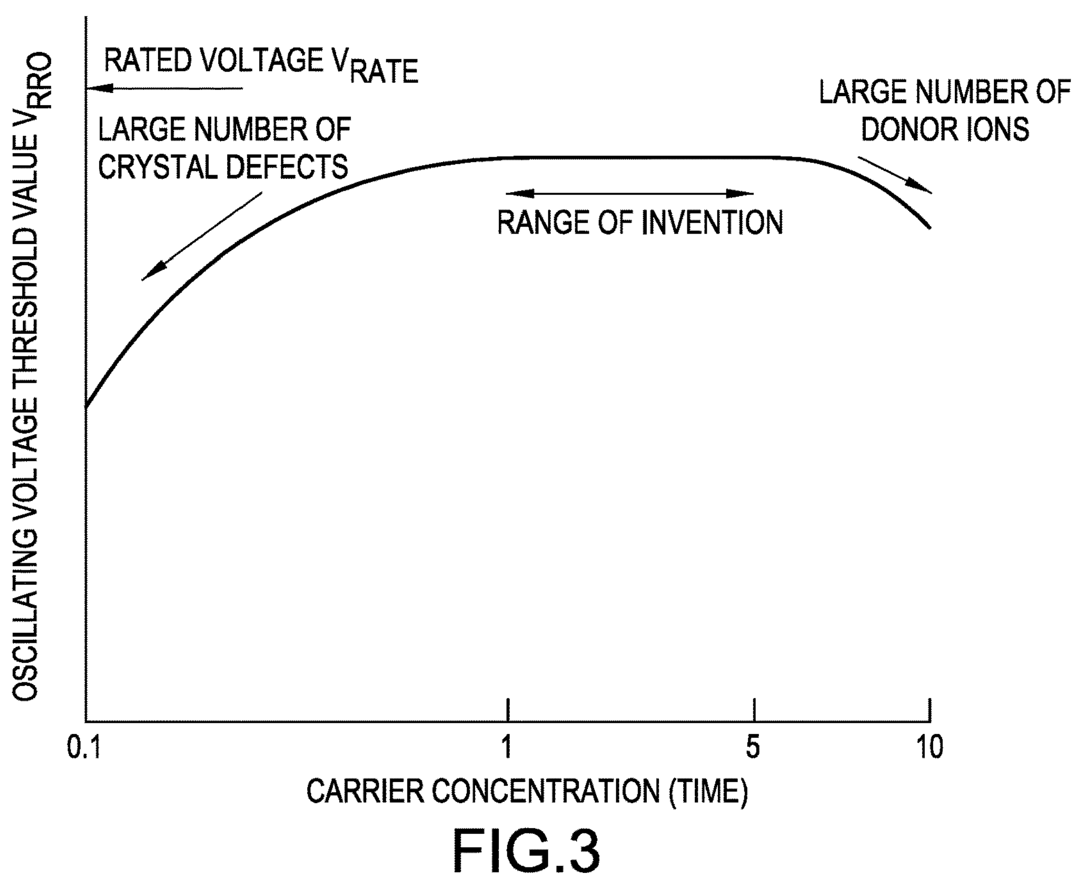
FIG. 3 is a characteristic diagram illustrating the relation between donor concentration and an oscillating voltage threshold value $V_{RRO}$.
Figure 13:
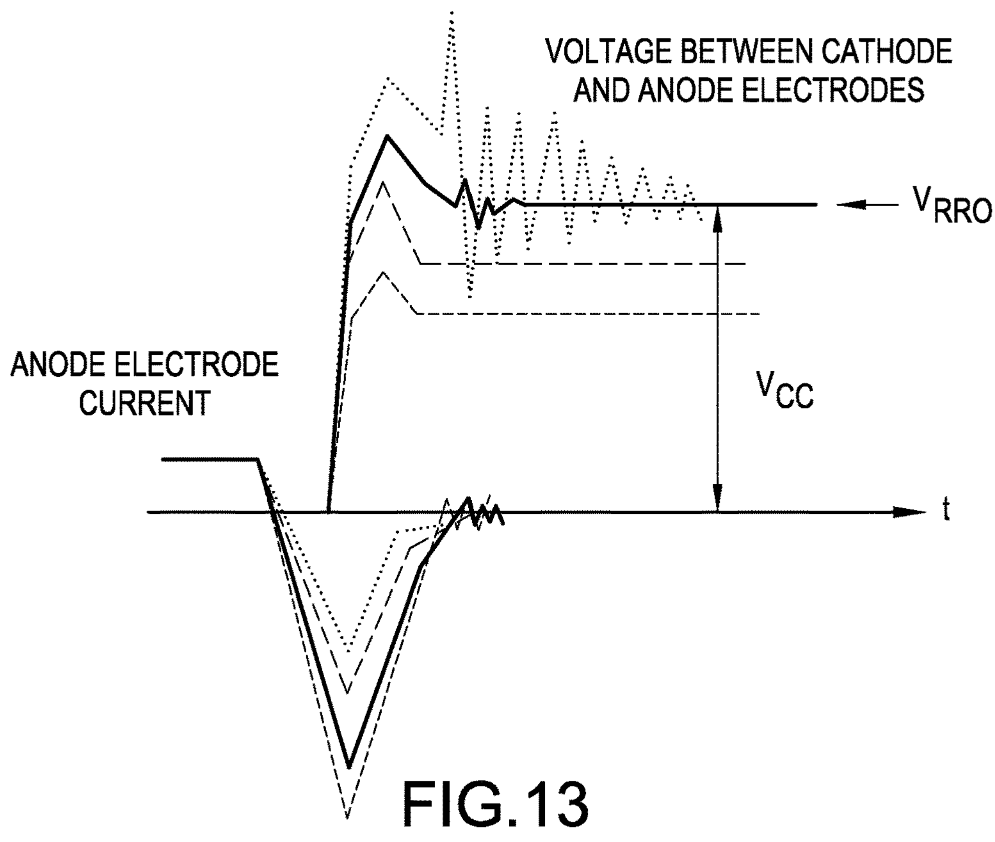
FIG. 13 is a schematic diagram illustrating the definition of the reverse recovery waveform and the oscillating voltage threshold value $V_{RRO}$ of the diode.

Next, the relation between an oscillating voltage threshold value $V_{RRO}$ and the average donor concentration of the carrier storage regions 15 and 16 will be described. As described above, the average donor concentration may be, for example, the average concentration $N_{mean}$ of the region M including the position with the minimum carrier concentration in the carrier storage regions 15 and 16. FIG. 3 is a characteristic diagram illustrating the relation between the donor concentration and the oscillating voltage threshold value $V_{RRO}$. FIG. 13 is a schematic diagram illustrating the definition of the reverse recovery waveform and the oscillating voltage threshold value $V_{RRO}$ of the diode. The oscillating voltage threshold value $V_{RRO}$ is defined as follows. As illustrated in FIG. 13, it is assumed that a forward current IF is fixed to a predetermined value by a chopper circuit which is an inductance load and the diode is reversely recovered on the basis of a power supply voltage $V_{CC}$ and the floating inductance Ls of the circuit. In this case, reverse recovery is repeated while the power supply voltage $V_{CC}$ is gradually increased. When the power supply voltage $V_{CC}$ is greater than a given value, the voltage and current waveforms of the diode oscillate. The value of the power supply voltage $V_{CC}$ at which the reverse recovery waveform starts to oscillate is defined as the oscillating voltage threshold value $V_{RRO}$. Since the oscillation phenomenon of the diode during reverse recovery is mainly caused by radiation noise, it is possible to suppress the oscillation as much as possible. It is preferable to maximize the oscillating voltage threshold value $V_{RRO}$ in order to suppress the oscillation during reverse recovery.

As illustrated in FIG. 3, when the concentration of the donors (donor concentration) generated by proton implantation is less than the carrier concentration (electron concentration) of the n-type silicon substrate 1, the crystal defects are not sufficiently recovered (there are many crystal defects). Therefore, as described above, the lifetime of carriers is reduced by the recombination center and the number of stored carriers is reduced. Therefore, the carriers are quickly depleted during reverse recovery. As a result, the voltage and current are likely to oscillate during the reverse recovery of the diode and the oscillating voltage threshold value $V_{RRO}$ is reduced. In particular, the oscillation phenomenon during reverse recovery is likely to occur when the forward current IF is less than one-tenth of the rated current.

In contrast, when the donor concentration (electron concentration) is significantly more than the carrier concentration (electron concentration) of the n-type silicon substrate 1, a neutral state is maintained by the electrons (negative charge), which are the majority carriers in the n-type silicon substrate 1, and the donor ions (positive charge) attached to the n-type silicon substrate 1. As a result, the number of holes, which are the minority carriers as the positive charge, is reduced (there are many donor ions). Specifically, when the donor concentration is more than five times the carrier concentration of the n-type silicon substrate 1, the holes are quickly depleted and the oscillating voltage threshold value $V_{RRO}$ starts to decrease. Therefore, preferably, the carrier concentration of the carrier storage regions 15 and 16 interposed between a plurality of n-type buffer layers 5, 6, and 7 is equal to or more than the carrier concentration of the n-type silicon substrate 1 and equal to or less than five times carrier concentration of the n-type silicon substrate 1.

Next, the range Rp of the protons for forming the deepest n-type buffer layer 5 from the rear surface 1*a* (that is, a distance Y from the rear surface of the n-type silicon substrate 1 to the peak carrier concentration position 5*a* of the deepest n-type buffer layer 5) will be described. The deepest n-type buffer layer 5 from the rear surface of the substrate is the n-type buffer layer closest to the p-type anode layer 3. A spatial charge region (the depletion layer in a broad sense) in which the n-type drift layer 2 is spread from the pn junction between the p-type anode layer 3 and the n-type drift layer 2 to the n-type cathode layer 4 during reverse recovery reaches first the deepest n-type buffer layer 5 among the plurality of n-type buffer layers 5, 6, and 7. The position of the deepest n-type buffer layer 5 is important in order to suppress reverse recovery oscillation.

Figure 9:
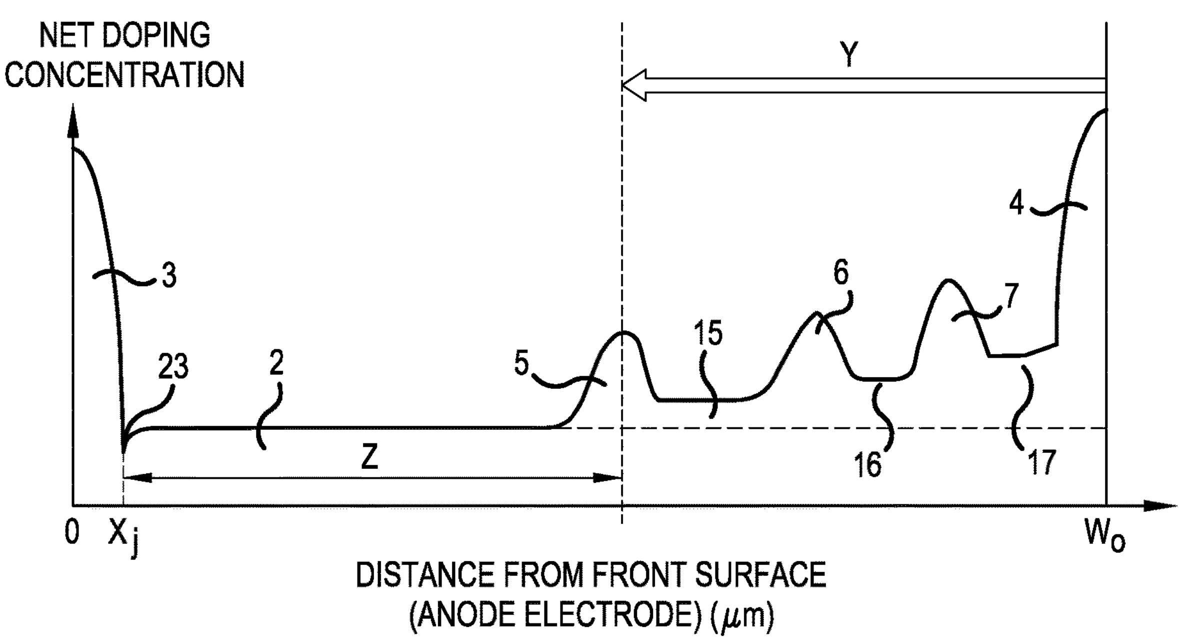
FIG. 9 is a characteristic diagram illustrating the net doping concentration of the semiconductor device according to Example 1 of the invention.

Next, the net doping concentration distribution of the PiN diode 100 will be described. FIG. 9 is a characteristic diagram illustrating the net doping concentration of the semiconductor device according to Example 1 of the invention. FIG. 9 schematically illustrates the net doping concentration distribution of the cross-section of the substrate in the depth direction from the p-type anode layer 3 to the n-type cathode layer 4 of the PiN diode 100. The final thickness (after a manufacturing process is completed) of the n-type silicon substrate 1 from the interface between the anode electrode 8 (not illustrated) and the p-type anode layer 3 which is the front surface of the n-type silicon substrate is simply referred to as the thickness of the substrate and is represented by $W_0$. The doping concentration of the n-type drift layer 2 is the doping concentration of the n-type silicon substrate 1. The diffusion depth of a pn junction 23 between the p-type anode layer 3 and the n-type drift layer 2 (hereinafter, simply referred to as a pn junction) is represented by xj. The deepest n-type buffer layer 5 is the n-type buffer layer closest to the p-type anode layer 3 and the distance from the pn junction 23 to the maximum concentration position (peak position 5*a*) of the deepest n-type buffer layer 5 is represented by Z. The rear surface of the n-type silicon substrate 1 is an interface between the n-type cathode layer 4 and the cathode electrode 9 (not illustrated). The depth from the rear surface of the substrate to the peak carrier concentration position 5*a* of the deepest n-type buffer layer 5 (hereinafter, referred to as a distance from the rear surface of the substrate to the peak position of the deepest n-type buffer layer 5) is represented by Y. In this case, the distance Y from the rear surface of the substrate to the peak position of the deepest n-type buffer layer 5 is represented by $Y=W_0-(xj+Z)$. The distance Y from the rear surface of the substrate to the peak position of the deepest n-type buffer layer 5 is the range Rp when protons are implanted into the rear surface of the substrate.

Figure 10:
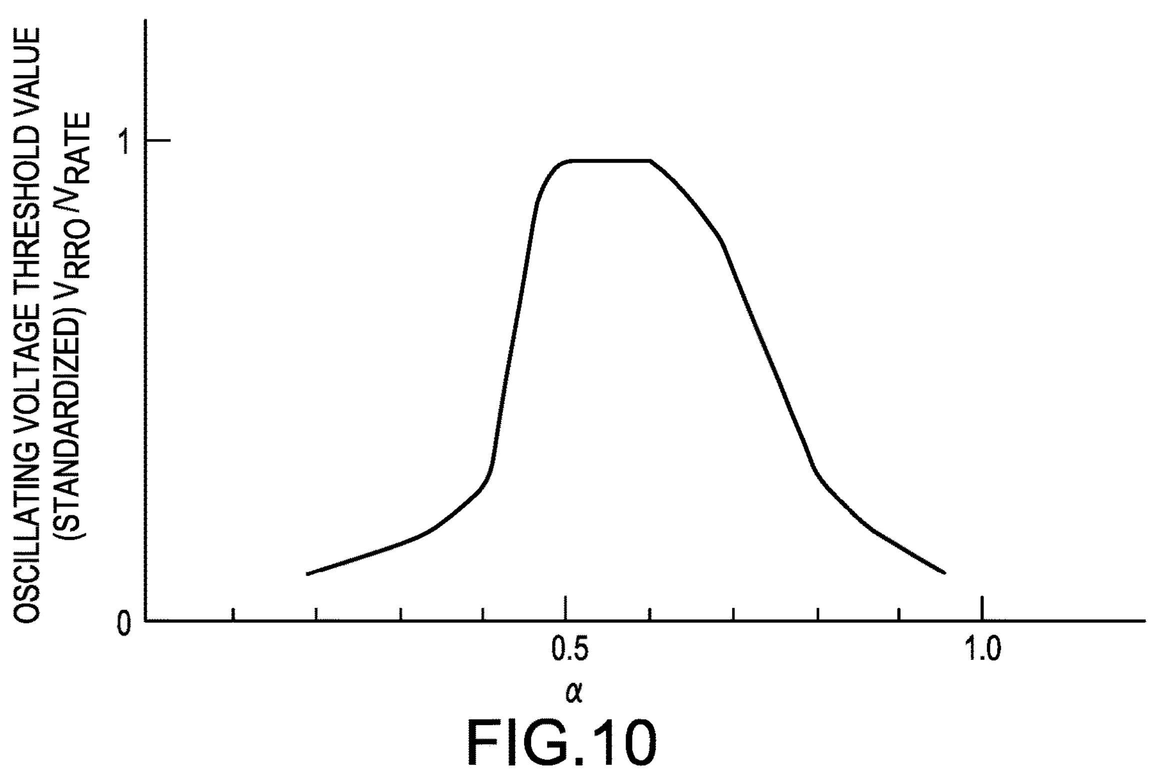
FIG. 10 is a characteristic diagram illustrating the relation between a coefficient α and a standardized oscillating voltage threshold value $V_{RRO}$.

It is preferable that the distance Y from the rear surface of the substrate to the peak position of the deepest n-type buffer layer 5 be in a numerical range capable of sufficiently increasing the oscillating voltage threshold value $V_{RRO}$. First, the distance Z from the pn junction 23 to the peak position of the deepest n-type buffer layer 5 with respect to the thickness $W_0$ of the substrate is $Z=aW_0$. Here, a is a non-dimensional coefficient. Then, the relation between the oscillating voltage threshold value $V_{RRO}$ and $Z=aW_0$ is examined. FIG. 10 is a characteristic diagram illustrating the relation between the coefficient $\alpha$ and the standardized oscillating voltage threshold value $V_{RRO}$. FIG. 10 illustrates the dependence of the oscillating voltage threshold value $V_{RRO}$ on the coefficient $\alpha$. In FIG. 10, the vertical axis indicates a value obtained by standardizing the oscillating voltage threshold value $V_{RRO}$ with a rated voltage $V_{rate}$. In the measurement of the oscillating voltage threshold value $V_{RRO}$, forward current density $J_F$ was 10 A/cm$^2$ and the floating inductance Ls of the circuit was 200 nH. In Example 1, the rated voltage $V_{rate}$ was 1200 V and the rated current density $J_{rate}$ was 200 A/cm$^2$. That is, the forward current density $J_F$ is one-twentieth of the rated current density $J_{rate}$. The thickness $W_0$ of the substrate is 120 μm. When the coefficient $\alpha$ is in the range of 0.4 to 0.8, the distance Z from the pn junction 23 to the peak position of the deepest n-type buffer layer 5 is in the range of 40% to 80% of the thickness $W_0$ of the substrate. As a result, the distance Y from the rear surface of the substrate to the peak position of the deepest n-type buffer layer 5 can be set to the range of 0.2 $W_0$-xj to 0.6$W_0$-xj by the above-mentioned expression. Therefore, it is possible to suppress the spreading of the spatial charge region at the distance Y from the rear surface of the substrate to the peak position of the deepest n-type buffer layer 5 and at a position which is closer to the rear surface (cathode) of the substrate than the peak position of the deepest n-type buffer layer 5. As a result, the oscillating voltage threshold value $V_{RRO}$ can be sufficiently close to the rated voltage. In addition, when the coefficient α is in the range of 0.45 to 0.7, preferably, in the range of 0.5 to 0.6, the oscillating voltage threshold value $V_{RRO}$ is the largest and can be stably increased.

The above-mentioned range of the coefficient α is preferable for the following reason. In general, a power semiconductor element, such as a diode, has a voltage that is about half the rated voltage as the power supply voltage $V_{CC}$. When a voltage Vak between both electrodes of the diode (a voltage between the anode and the cathode) is equal to about the power supply voltage $V_{CC}$ during reverse recovery, the reverse recovery current is the maximum. However, in this case, the width $x_0$ of the spatial charge region which is spread from the pn junction 23 to the n-type drift layer 2 of the diode is typically about 50% of the thickness $W_0$ of the substrate. The maximum value of the reverse recovery current also depends on the circuit conditions, but is appropriately equal to the rated current density $J_{rate}$. In the spatial charge region, holes are moved to the p-type anode layer 3. Therefore, the speed of the holes is a carrier saturation speed $v_{sat}$ (about $8\times10^6$ cm/s) and hole concentration p is substantially constant in the spatial charge region. The average electric field intensity of the spatial charge region is, for example, about $1.5\times10^5$ V/cm and current density J in the spatial charge region is $J=qv_{sat}p$ (where q is an elementary charge and p is hole concentration).

The average gradient of the electric field intensity E of the spatial charge region is $Em/x_0=(q/s_S)(p+Nd)$ from the Poisson's equation (where Em is the maximum electric field intensity and $s_S$ is the permittivity of a semiconductor (here, silicon) ($11.9\times8_0$ in silicon; $8_0$ is vacuum permittivity and is $8.85\times10^{-14}$ F/cm)). Here, Nd is the doping concentration of the n-type silicon substrate 1. As described above, the hole concentration p is substantially constant and is $p=J/(qv_{sat})$ from the abovementioned current density J. As described above, the current density J is the maximum value of the reverse recovery current density. Here, for simplicity, the current density J is considered as the rated current density $J_{rate}$. In addition, when the reverse recovery current is the maximum, the voltage Vak between both electrodes of the diode is equal to the power supply voltage $V_{CC}$. The power supply voltage $V_{CC}$ is about half the rated voltage. Since the integrated value of the electric field intensity of the spatial charge region is equal to Vak ($=V_{CC}$), $V_{rate}/2=(½)Em\cdot x_0^2$ is established. When Em is removed from the Poisson's equation, $x_0$ is represented by the following Equation (3).

Equation 3

$$x_0 = \sqrt{\frac{\varepsilon_S V_{rate}}{\left(\frac{J_{rate}}{qv_{sat}} + N_d\right)}} \tag{2}$$

As described above, $x_0$ can be referred to as the appropriate width of the spatial charge region during reverse recovery when the rated voltage and the rated current density $J_{rate}$ are determined. In Example 1 of the invention, $x_0$ is referred to as a distance index $x_0$. It is effective to suppress the spreading of the spatial charge region around the distance index $x_0$ in order to suppress oscillation during reverse recovery. In particular, when the spreading of the spatial charge region is further suppressed at the time the voltage Vak between both electrodes of the diode reaches the power supply voltage $V_{CC}$, it is possible to suppress the depletion of the stored carriers (carriers in an electrically neutral region in which the concentration of electrons is substantially equal to that of holes) which are reduced during the subsequent reverse recovery process. As described above, the width of the spatial charge region during reverse recovery is about 50% of the thickness $W_0$ of the substrate around the distance index $x_0$. Therefore, the distance Z from the pn junction 23 to the peak position of the deepest n-type buffer layer 5 is set in the range of $0.4W_0$ to $0.8W_0$ including $0.5W_0$, which is half the thickness $W_0$ of the substrate. That is, the peak position of the deepest n-type buffer layer 5 is disposed in the vicinity of the center of the substrate in the depth direction, or it slightly deviates from the center to the cathode. Therefore, the distance Y from the rear surface of the substrate to the peak position of the deepest n-type buffer layer 5 can be set in the range of ($0.2W_0$-xj) to ($0.6W_0$-xj) and it is possible to strongly suppress the oscillation phenomenon.

Figure 11:
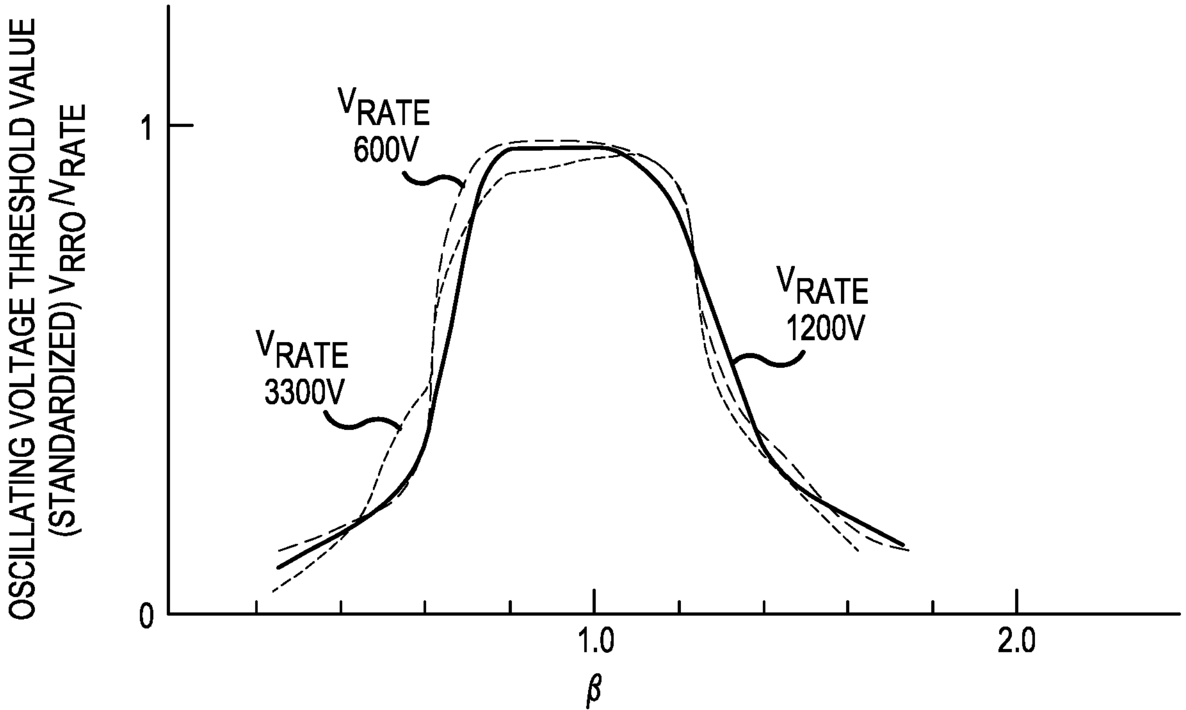
FIG. 11 is a characteristic diagram illustrating the relation between a coefficient β and a standardized oscillating voltage threshold value $V_{RRO}$ in a diode with a rated voltage of 1200 V according to Example 1.

In addition, the preferred range of the distance Y from the rear surface of the substrate to the peak position of the deepest n-type buffer layer 5 with respect to the distance index $x_0$ will be described. When the final thickness of the substrate is determined by, for example, grinding from the rear surface of the substrate, protons are implanted into the rear surface in order to form the n-type buffer layer 5. Therefore, the distance Y from the rear surface of the substrate to the peak position of the deepest n-type buffer layer 5 has a great effect on all electrical characteristics of the diode, particularly, switching characteristics such as reverse recovery. First, it is assumed that the distance Z from the pn junction 23 to the peak position of the deepest n-type buffer layer 5 is $Z=\beta x_0$. Here, β is a non-dimensional coefficient. FIG. 11 is a characteristic diagram illustrating the relation between the coefficient β and the standardized oscillating voltage threshold value $V_{RRO}$ in the diode with a rated voltage of 1200 V according to Example 1. FIG. 11 illustrates the dependence of the oscillating voltage threshold value $V_{RRO}$ on the coefficient β (that is, the dependence of the peak position of the deepest n-type buffer layer 5 from the rear surface of the substrate on the distance index $x_0$). In FIG. 11, the vertical axis indicates a value obtained by standardizing the oscillating voltage threshold value $V_{RRO}$ with the rated voltage $V_{rate}$. When the coefficient β is in the range of 0.6 to 1.4, the distance Y from the rear surface of the substrate to the peak position of the deepest n-type buffer layer 5 is in the range of 31.8 μm to 80.5 μm and the oscillating voltage threshold value $V_{RRO}$ has a large value in this range. When the coefficient β is in the range of 0.7 to 1.2, the distance Y from the rear surface of the substrate to the peak position of the deepest n-type buffer layer 5 is in the range of 44.0 μm to 74.4 μm. In the range of the distance Y from the rear surface of the substrate to the peak position of the deepest n-type buffer layer 5, the oscillating voltage threshold value $V_{RRO}$ can reach 80% or more of the rated voltage $V_{rate}$. When the coefficient β is in the range of 0.8 to 1.0, the distance Y from the rear surface of the substrate to the peak position of the deepest n-type buffer layer 5 is in the range of 56.2 μm to 68.3 μm. In the range of the distance Y from the rear surface of the substrate to the peak position of the deepest n-type buffer layer 5, it is possible to stably increase the oscillating voltage threshold value $V_{RRO}$. In addition, FIG. 11 illustrates the relation between the coefficient β and the standardized oscillating voltage threshold value $V_{RRO}$ when the rated voltage is 600 V and 3300 V. When the rated voltage is 600 V and 3300 V, it is possible to stably increase the oscillating voltage threshold value $V_{RRO}$ in the same range of the coefficient β as that when the rated voltage is 1200 V.

As described above, for the distance Y from the rear surface of the substrate to the peak position of the deepest n-type buffer layer 5, when the coefficient α, which is the ratio of the distance Z from the pn junction 23 to the peak position of the deepest n-type buffer layer 5 to the thickness $W_0$ of the substrate, or the coefficient β, which is the ratio of the distance Z from the pn junction 23 to the peak position of the deepest n-type buffer layer 5 to the distance index $x_0$, is in a predetermined range, it is possible to improve the effect of suppressing oscillation. In the above-mentioned example, the coefficient α and the coefficient β seem to be equivalent to the oscillating voltage threshold value $V_{RRO}$. However, the coefficient α and the coefficient β are not equivalent to the oscillating voltage threshold value $V_{RRO}$ and are independent from each other. For example, when the thickness $W_0$ of the substrate is greater than 120 μm which is the thickness of the substrate in Example 1, in some cases, the oscillating voltage threshold value $V_{RRO}$ shifts to the value less than a=0.5. The reason is that the dependence of the oscillating voltage threshold value $V_{RRO}$ on the coefficient β of the distance index $x_0$ is less than the dependence of the oscillating voltage threshold value $V_{RRO}$ on the coefficient α and the distance index $x_0$ is relatively close to the position of the p-type anode layer 3.

With an increase in the thickness of the substrate, the region in which the stored carriers are present expands in the depth direction of the substrate. Therefore, the depletion of the carriers during reverse recovery is further suppressed, but a forward voltage drop or reverse recovery loss increases with the increase in the thickness of the substrate. When the thickness $W_0$ of the substrate is less than 120 μm, the distance index $x_0$ is relatively moved to the n-type cathode layer 4 by a value corresponding to the reduction in the thickness $W_0$ of the substrate. Therefore, the oscillating voltage threshold value $V_{RRO}$ shifts to a value greater than a=0.5.

In addition to the thickness of the substrate, for the forward current density $J_F$ when reverse recovery starts and the floating inductance Ls of the circuit, the relation between the coefficients α and β and the oscillating voltage threshold value $V_{RRO}$ is slightly changed. However, when the coefficient α and the coefficient β are in the above-mentioned ranges, it is possible to sufficiently increase the oscillating voltage threshold value $V_{RRO}$ in the wide range of each of the forward current density $J_F$ and the floating inductance $L_S$ of the circuit and to suppress oscillation.

This numerical range can also be applied to other rated voltages. FIG. 15 illustrates the values of the distance index $x_0$ and the distance Y from the rear surface of the substrate to the peak position of the deepest n-type buffer layer 5 when the coefficient β is applied to the distance index $x_0$ at various rated voltages. FIG. 15 is a table illustrating the distance Y from the rear surface of the substrate to the peak position of the deepest n-type buffer layer 5 at each rated voltage. Here, $Y=W_0-(\beta x_0+X_j)$ and $X_j=3.0$ μm are established.

It was confirmed that the coefficient β depended on the rated voltage, but it was possible to increase the oscillating voltage threshold value $V_{RRO}$ at any rated voltage when the coefficient β was in the above-mentioned numerical range, as illustrated in FIG. 11. It is preferable that the coefficient β be in the range of 0.6 to 1.4 in order to maintain the sufficiently large oscillating voltage threshold value $V_{RRO}$. When the coefficient β is in the range of 0.7 to 1.2, preferably, in the range of 0.8 to 1.0, it is possible to stably maintain the sufficiently large oscillating voltage threshold value $V_{RRO}$ close to the rated voltage $V_{rate}$ at any rated voltage.

In Example 1, three n-type buffer layers 5, 6, and 7 are formed. However, the number of n-type buffer layers is not limited to three, but two n-type buffer layers or four or more n-type buffer layers may be formed. In particular, it is preferable to increase the number of n-type buffer layers in order to increase the breakdown voltage of the element. In this case, preferably, for at least the deepest n-type buffer layer 5, for example, the relation between the first width W1 and the second width W2, the carrier concentration of the carrier storage region 15, the carrier concentration distribution, and the distance Y from the rear surface of the substrate (proton implantation surface) to the deepest n-type buffer layer 5 are in the abovementioned preferred ranges.

For example, in some cases, the oscillating voltage threshold value $V_{RRO}$ is greater than the rated voltage $V_{rate}$, depending on the value of the coefficient α or the coefficient β or circuit conditions. For example, the oscillating voltage threshold value $V_{RRO}$ may be sufficiently close to the breakdown voltage.

COMPARATIVE EXAMPLE

The comparative example (dotted line) illustrated in FIG. 2 in which a heat treatment is performed at 380° C. after proton implantation will be described. In the comparative example, the ranges of proton implantation for forming three n-type buffer layers from the rear surface of the substrate are about 50 μm, 25 μm, and 10 μm. In addition, the impurity concentration (carrier concentration) of the n-type silicon substrate 1 is less than that in Example 1.

Since proton implantation for forming the deepest n-type buffer layer is performed with high acceleration energy, a large number of crystal defects occur over a wide width (thickness) in the vicinity of a range of about 50 μm from the rear surface 1*a* of the n-type silicon substrate 1. The crystal defects are not sufficiently recovered by the heat treatment which is performed at 380° C. Therefore, the carrier concentration of the deepest n-type buffer layer is significantly less than the carrier concentration of the n-type silicon substrate 1 on the near side of the peak position of the carrier concentration (between the deepest n-type buffer layer and the n-type buffer layer close to the cathode side of the deepest n-type buffer layer). In addition, a first width W1' from the peak position of the deepest n-type buffer layer to the anode is less than a second width W2' from the peak position of the deepest n-type buffer layer to the cathode. That is, in the comparative example, the crystal defects are not sufficiently recovered, which results in an increase in leakage current. In addition, since the lifetime is short and the stored carriers are reduced, holes are quickly depleted. When the spatial charge region reaches the deepest n-type buffer layer, the rate of change of voltage dV/dt increases rapidly. Therefore, since the spreading of the spatial charge region is strongly suppressed, the voltage and current oscillate during reverse recovery and radiation noise is generated.

As described above, according to Example 1, the spreading of the depletion layer is suppressed, the breakdown voltage is ensured, and generation loss is reduced. It is possible to suppress the oscillation of voltage and current during a switching operation. In addition, according to Example 1, since the crystal defects are recovered, it is possible to reduce the amount of leakage current and thus reduce the risk of thermal runaway during a high-temperature operation.

Example 2

Figure 4:
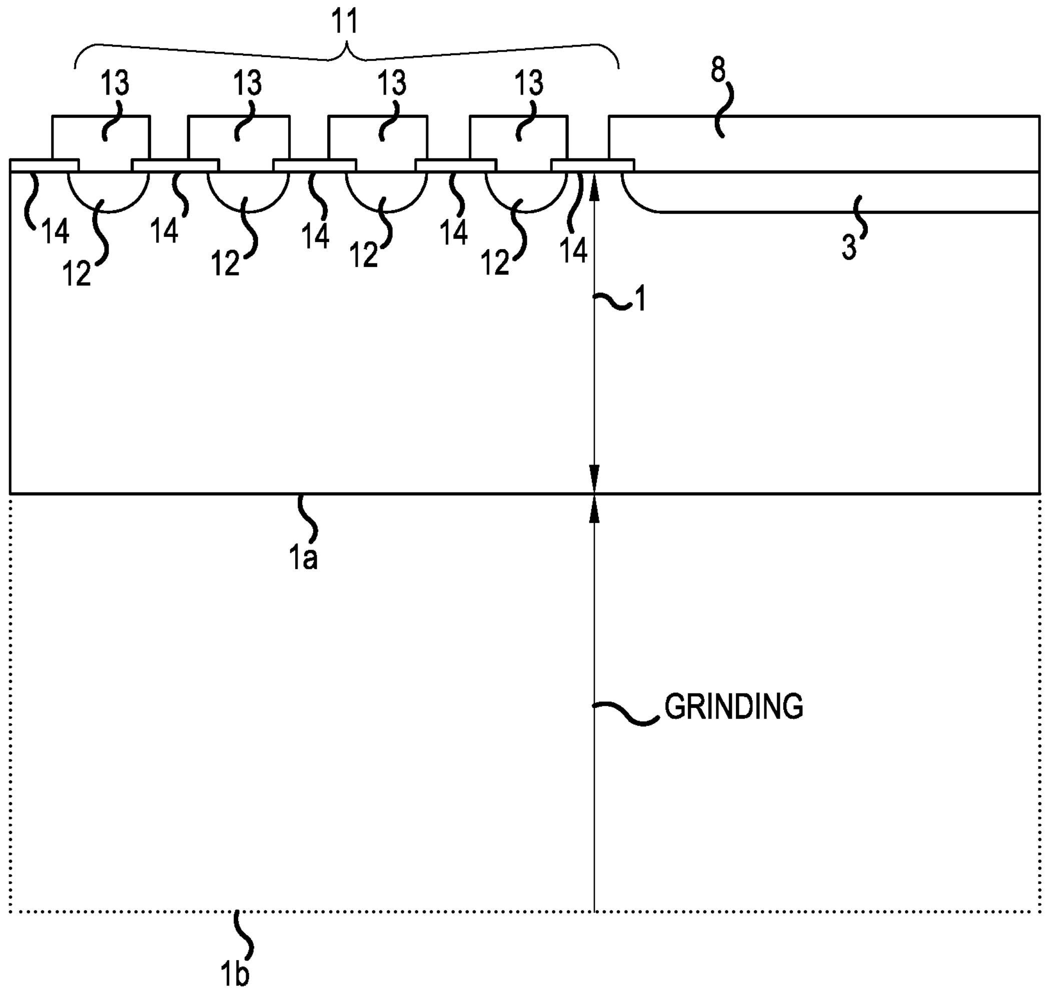
FIG. 4 is a cross-sectional view illustrating the state of a semiconductor device according to Example 2 of the invention which is being manufactured.

Next, a method for manufacturing the semiconductor device illustrated in FIGS. 1A and 1B will be described as Example 2. FIGS. 4 to 7 are cross-sectional views illustrating the state of the semiconductor device according to Example 2 of the invention which is being manufactured. First, as illustrated in FIG. 4, for example, the p-type anode layer 3 and the p-type layer 12 of the high-breakdown-voltage junction termination structure 11 are selectively formed in a surface layer of one main surface of the n-type silicon substrate 1 with a thickness of about 500 μm. Then, the insulating film 14, which is an oxide film, is formed on the surface of a region of the n-type silicon substrate 1 which is interposed between the p-type anode layer 3 and the p-type layer 12 and on the surface of a region interposed between the p-type layers 12. Then, the anode electrode 8 is formed on the p-type anode layer 3 and the termination electrode 13 is formed on the p-type layer 12. Then, the other surface (the rear surface 1*b* of the n-type silicon substrate 1) of the n-type silicon substrate 1 is ground and polished and the thickness of the n-type silicon substrate 1 is reduced to about 120 μm.

Figure 5:
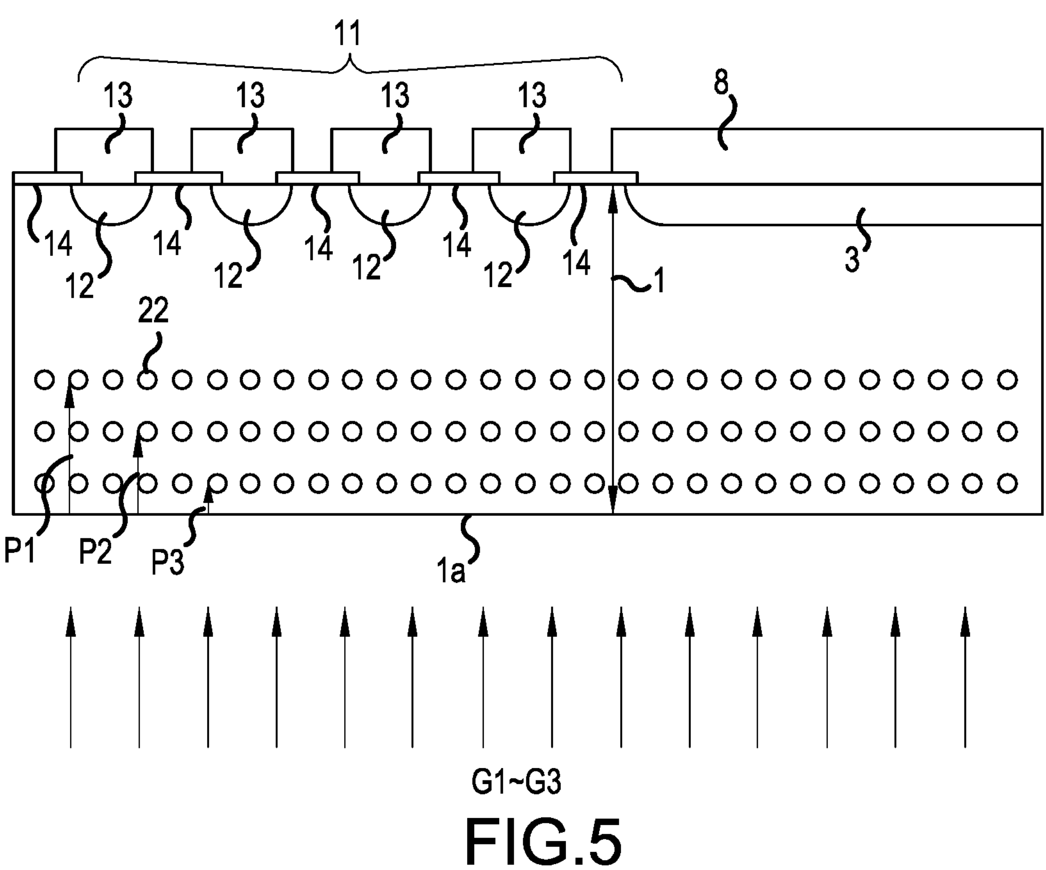
FIG. 5 is a cross-sectional view illustrating the state of the semiconductor device according to Example 2 of the invention which is being manufactured, following FIG. 4.

Then, as illustrated in FIG. 5, proton implantation (G1, G2, and G3) is performed three times on the ground surface of the n-type silicon substrate 1 (the rear surface 1*a* of the n-type silicon substrate 1) with a dose (E1) of about $1\times10^{13}$ $cm^{-2}$ at acceleration energy levels of 2.2 MeV, 1.5 MeV, and 0.5 MeV. In the proton implantation (G1, G2, and G3), the ranges (P1, P2, and P3) of protons 22 from the implantation surface (the rear surface 1*a* of the n-type silicon substrate 1) are about 60 μm, 25 μm, and 6 μm.

Figure 6:
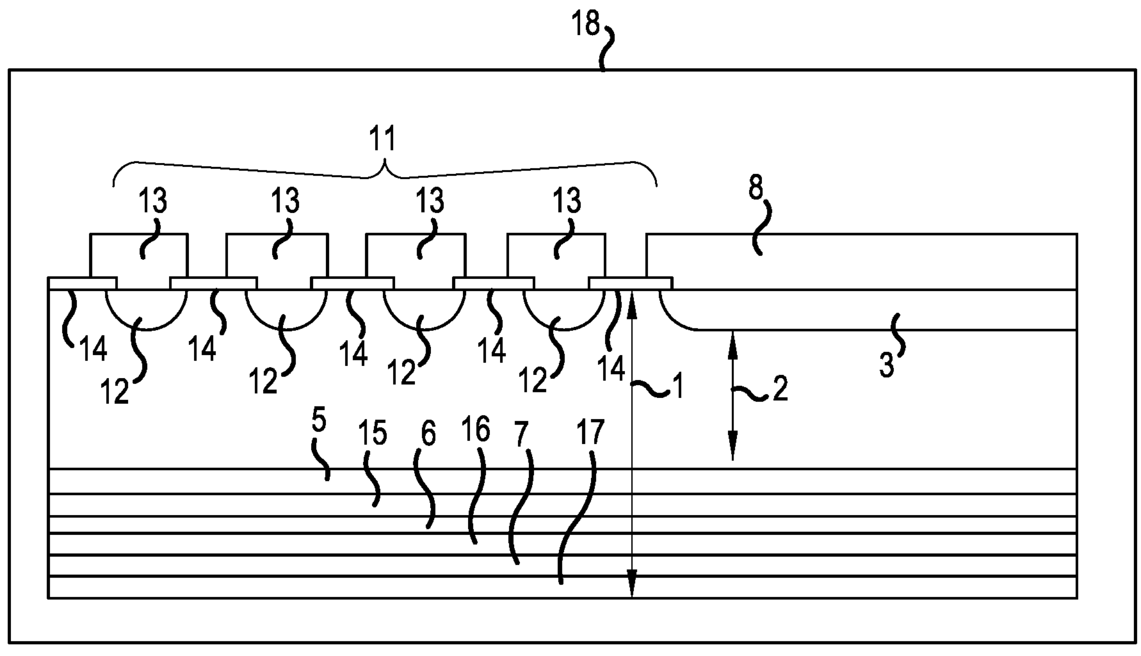
FIG. 6 is a cross-sectional view illustrating the state of the semiconductor device according to Example 2 of the invention which is being manufactured, following FIG. 5.

Then, as illustrated in FIG. 6, the n-type silicon substrate 1 subjected to the proton implantation (G1, G2, and G3) is set in an annealing furnace 18 and a heat treatment is performed, for example, at a temperature of 420° C. for 3 hours. Crystal defects which occur in the passage region of the protons 22 are recovered by the heat treatment and the protons 22 introduced into the n-type silicon substrate 1 are changed into donors. In this way, the n-type buffer layers 5, 6, and 7 illustrated in FIG. 2 are formed.

Figure 7:
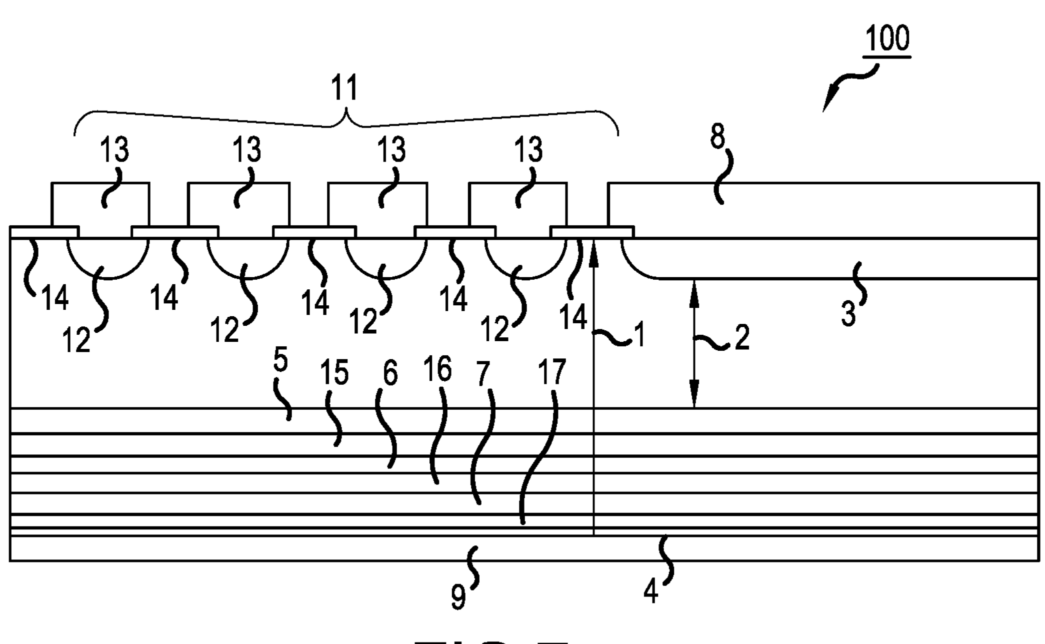
FIG. 7 is a cross-sectional view illustrating the state of the semiconductor device according to Example 2 of the invention which is being manufactured, following FIG. 6.
Figure 8:
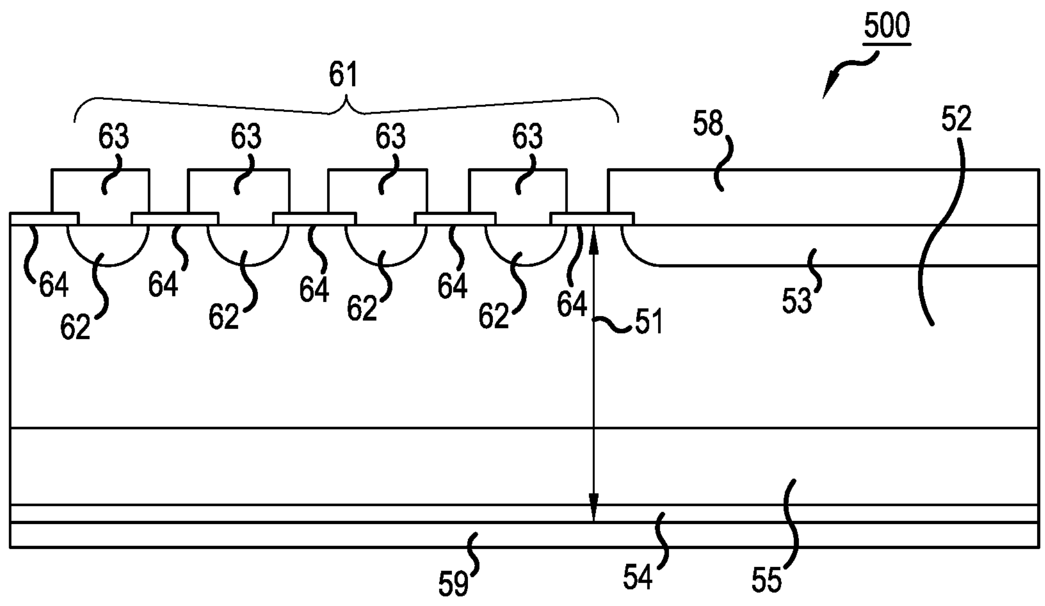
FIG. 8 is a cross-sectional view illustrating a main portion of a PiN diode 500 including a general n-type buffer layer 55.

Then, as illustrated in FIG. 7, the n-type silicon substrate 1 is taken out from the annealing furnace 18 and the n-type cathode layer 4 is formed in a surface layer of the other surface (rear surface 1*a*) of the n-type silicon substrate 1. Then, the cathode electrode 9 is formed on the n-type cathode layer 4. In this way, the PiN diode 100 illustrated in FIGS. 1A and 1B is completed. Since the heat treatment for forming the n-type cathode layer 4 is performed by, for example, laser annealing, it has no effect on each of the n-type buffer layers 5, 6, and 7 which are formed at positions deeper than the n-type cathode layer 4 from the rear surface 1*a* of the n-type silicon substrate 1. In addition, when a plurality of n-type buffer layers are formed after the other surface of the n-type silicon substrate 1 is ground to reduce the thickness of the n-type silicon substrate 1 (step illustrated in FIG. 4), the n-type cathode layer 4 may be formed in the surface layer of the other surface (rear surface 1*a*) of the n-type silicon substrate 1 by proton implantation.

The carrier concentration peak position 5*a* of the deepest n-type buffer layer 5 is formed at a depth of 60 μm from the rear surface 1*a* of the n-type silicon substrate 1 by the above-mentioned manufacturing process. In addition, the carrier concentration of the carrier storage regions 15 and 16 interposed between the n-type buffer layers 5, 6, and 7 is more than the carrier concentration of the n-type silicon substrate 1 and is flat. In the carrier concentration distribution of the n-type buffer layers 5, 6, and 7, the first width W1 from the carrier concentration peak position 5*a* of the deepest n-type buffer layer 5 to the anode is more than the second width W2 from the carrier concentration peak position 5*a* of the deepest n-type buffer layer 5 to the cathode. The reason is that the acceleration energy of the proton implantation G1 for forming the deepest n-type buffer layer 5 is high and a proton implantation amount distribution extends from the peak position to the anode and the cathode. Since crystal defects can occur in the region in which the proton 22 is present, they are also spread from the peak position of the proton implantation amount to the anode. The crystal defects which are spread to the anode to be deeper than the peak position of the proton implantation amount are recovered. In this region, the protons are also changed into donors. Therefore, in the carrier concentration distribution of the deepest n-type buffer layer 5, the first width W1 from the peak position 5*a* to the anode is more than the second width W2 from the peak position 5*a* to the cathode.

A heat treatment was performed at a temperature of about 420° C. after the proton implantation (G1, G2, and G3) and the carrier concentration distribution of the n-type buffer layers 5, 6, and 7 was measured by a known spreading resistance measurement method (SR method). FIG. 2 illustrates the measurement result. When the heat treatment is performed at a temperature of 420° C., the carrier concentration of the carrier storage regions 15 and 16 interposed between the n-type buffer layers 5, 6, and 7 is equal to or more than the carrier concentration of the n-type silicon substrate 1. In the carrier concentration distribution of the deepest n-type buffer layer 5, the first width W1 from the peak position 5*a* to the anode is more than the second width W2 from the peak position 5*a* to the cathode.

In the heat treatment after the proton implantations (G1, G2, and G3), the heat treatment temperature may be in the range of 400° C. to 500° C. and the heat treatment time may be in the range of 1 hour to 10 hours. Preferably, the heat treatment temperature is in the range of 420° C. to 450° C. and the heat treatment is in the range of 1 hour to 3 hours.

The inventors found that the relation between the range Rp (the peak position 5*a* of the deepest n-type buffer layer 5, unit: μm) of protons in silicon and the acceleration energy E (eV) of the protons was represented by the following Equation (4) when log(Rp) was x and log(E) of was y.

$$y=-0.0047x^4+0.0528x^3-0.2211x^2+0.9923x+5.0474 \qquad \text{Equation (4)}$$

Figure 14:
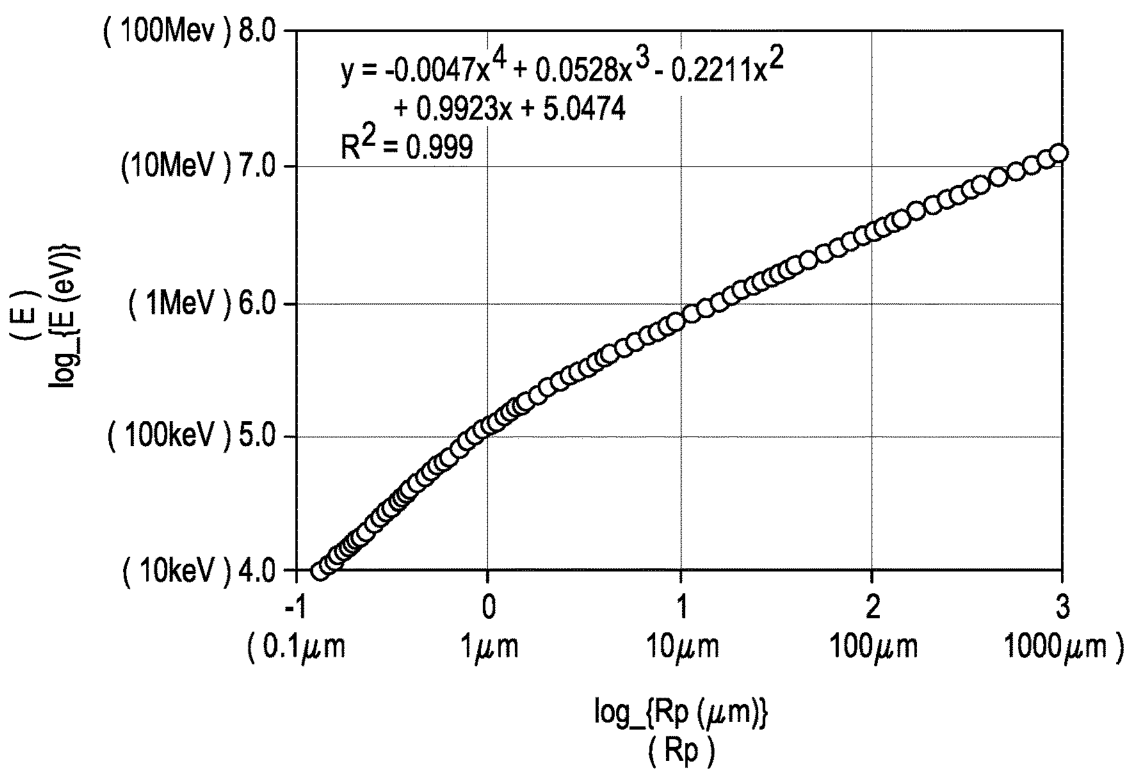
FIG. 14 is a characteristic diagram illustrating the relation between the logarithm (log(Rp)) of the range Rp of a proton in proton implantation and the logarithm (log(E)) of the acceleration energy E of the proton in Example 2 of the invention.

FIG. 14 is a graph illustrating the above-mentioned Equation (4). FIG. 14 is a characteristic diagram illustrating the relation between the logarithm (log(E)) of the acceleration energy E of the protons and the logarithm (log(Rp)) of the range Rp of the protons in the proton implantation according to Example 2 of the invention. In FIG. 14, the horizontal axis is log(Rp) and indicates the range Rp (μm) corresponding to the parentheses below the axis value of log(Rp). In addition, in FIG. 14, the vertical axis is log(E) of and indicates the acceleration energy E corresponding to the parentheses on the left side of the axis value of log(E). The above-mentioned Equation (4) is obtained by fitting the value of log(Rp) and the value of the logarithm log(E) of the acceleration energy with a four-order polynomial of x (=log(Rp)).

The use of the above-mentioned Equation 4 makes it possible to calculate the acceleration energy E of the protons required to obtain a desired distance Y from the rear surface of the substrate to the peak position of the deepest n-type buffer layer 5, using the distance Y as the range Rp. When a sample in which protons are implanted with the acceleration energy E that is calculated and set from a predetermined range Rp by the above-mentioned Equation (4) is actually measured by the known spreading resistance measurement method (SR method), the measured value is exactly equal to a predetermined value. In addition, at each rated voltage illustrated in FIG. 15, even when the deepest n-type buffer layer 5 corresponding to the preferred value (range) of the distance Y from the rear surface of the substrate to the peak position of the deepest n-type buffer layer 5 is formed, it is possible to calculate the acceleration energy E using the above-mentioned Equation 4. For example, at each rated voltage illustrated in FIG. 15, the largest distance Y from the rear surface of the substrate to the peak position of the deepest n-type buffer layer 5 is 454.4 μm which corresponds to a rated voltage of 6500 V and 13=0.6. The acceleration energy E of the protons corresponding to the distance Y is 7.6 MeV, that is, about 8.0 MeV. The smallest distance Y from the rear surface of the substrate to the peak position of the deepest n-type buffer layer 5 is 17.5 μm which is slightly greater than 15 μm from the rear surface of the substrate and corresponds to, for example, a rated voltage of 600 V and 13=1.3. The acceleration energy E of the protons corresponding to the distance Y from the rear surface of the substrate to the peak position of the deepest n-type buffer layer 5 is 1.1 MeV, that is, about 1.0 MeV. Therefore, for example, the acceleration energy E of the protons is preferably equal to or more than 1.0 MeV and equal to or less than 8.0 MeV.

The following relation may be considered between the actual acceleration energy E' and the actual range Rp' (the peak position of the carrier concentration of the deepest n-type buffer layer 5) which is measured by, for example, the spreading resistance (SR) measurement method when the above-mentioned fitting equation represented by the above-mentioned Equation (4) is used to set the acceleration energy E of proton implantation from the desired range Rp of the protons and the protons are implanted into silicon with the set acceleration energy. That is, when the actual acceleration energy E' is in the range of about ±5% of the calculated acceleration energy E, the actual average range Rp' is within the range of about ±5% of the calculated range Rp and is in a measurement error range. Therefore, the influence of the deviation of the actual average range Rp' from the calculated range Rp on the characteristics is sufficiently reduced. When the actual acceleration energy E' is in the range of ±5% of the calculated acceleration energy E, it is possible to determine that the actual average range Rp' is substantially equal to the set range Rp. In the actual accelerator, since the acceleration energy E and the average range Rp are both in the above-mentioned measurement error range (±5%), it is considered that the actual acceleration energy E' and the actual range Rp' follow the above-mentioned Equation (4) represented by the desired range Rp and the calculated acceleration energy E and no problem occurs.

At each rated voltage illustrated in FIG. 15, the acceleration energy E of proton implantation for forming the deepest n-type buffer layer 5 may be calculated and set by the fitting equation represented by the above-mentioned Equation 4 so as to correspond to the value (range) of the coefficient α or the coefficient β, using the distance Y from the rear surface of the substrate to the peak position of the deepest n-type buffer layer 5 as the range Rp. Specifically, for example, preferably, the acceleration energy E has the following value, on the basis of the range of the coefficient β.

When the rated voltage is 600 V, for example, the acceleration energy E of proton implantation for forming the deepest n-type buffer layer 5 is in the range of 1.1 MeV to 1.8 MeV, preferably, in the range of 1.2 MeV and 1.7 MeV, and more preferably, in the range of 1.4 MeV to 1.6 MeV. When the rated voltage is 1200 V, for example, the acceleration energy E of proton implantation for forming the deepest n-type buffer layer 5 is in the range of 1.6 MeV to 2.8 MeV, preferably, in the range of 1.9 MeV to 2.6 MeV, and more preferably, in the range of 2.2 MeV to 2.5 MeV.

When the rated voltage is 1700 V, for example, the acceleration energy E of proton implantation for forming the deepest n-type buffer layer 5 is in the range of 1.9 MeV to 3.4 MeV, preferably, in the range of 2.4 MeV to 3.3 MeV, and more preferably, in the range of 2.8 MeV to 3.1 MeV. When the rated voltage is 3300 V, for example, the acceleration energy E of proton implantation for forming the deepest n-type buffer layer 5 is in the range of 3.0 MeV to 5.1 MeV, preferably, in the range of 3.6 MeV to 4.8 MeV, and more preferably, in the range of 4.1 MeV to 4.6 MeV.

When the rated voltage is 4500 V, for example, the acceleration energy E of proton implantation for forming the deepest n-type buffer layer 5 is in the range of 3.7 MeV to 6.1 MeV, preferably, in the range of 4.4 MeV to 5.8 MeV, and more preferably, in the range of 5.0 MeV to 5.6 MeV. When the rated voltage is 6500 V, for example, the acceleration energy E of proton implantation for forming the deepest n-type buffer layer 5 is in the range of 4.7 MeV to 7.6 MeV, preferably, in the range of 5.5 MeV to 7.3 MeV, and more preferably, in the range of 6.2 MeV to 6.9 MeV. The rated voltage is not limited to the above-mentioned values. When the rated voltage is, for example, 400 V, 1400 V, and 2500 V other than the abovementioned values, the acceleration energy E may be set from the desired range Rp by the same method as described above.

The use of the above-mentioned Equation 4 makes it possible to calculate the necessary acceleration energy E from the range Rp of proton implantation with high accuracy and to set the acceleration energy during proton implantation. In this way, it is possible to suppress the oscillation of the voltage and current during the reverse recovery of the PiN diode 100. In addition, the spreading of the depletion layer is suppressed and it is possible to ensure the breakdown voltage even when the thickness of the n-type silicon substrate 1 is reduced. It is possible to reduce generation loss. The soft recovery characteristics of the PiN diode 100 are improved and a surge voltage and radiation noise are reduced. In addition, the crystal defects caused by proton implantation are recovered and it is possible to reduce a leakage current. Therefore, it is possible to reduce the risk of thermal runaway during a high-temperature operation.

In Example 2, proton implantation is performed three times. However, the number of proton implantation processes can be set to any value. As described above, according to Example 2, it is possible to obtain the same effect as that in Example 1.

Example 3

Figures 12A, 12B:
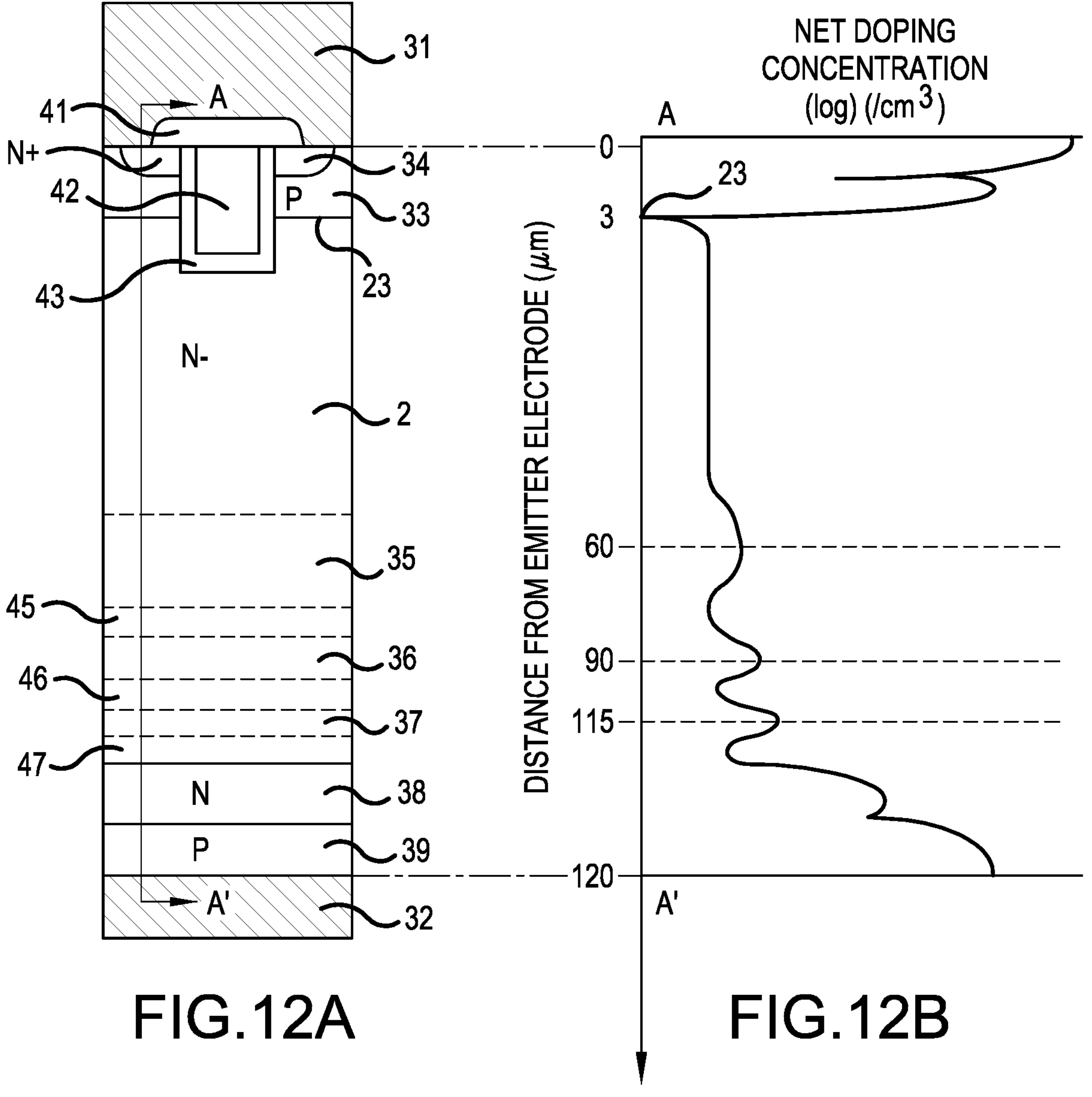
FIGS. 12A and 12B are diagrams illustrating the structure of a semiconductor device according to Example 3 of the invention.

Next, the structure of an insulated gate bipolar transistor (IGBT) will be described as an example of the structure of a semiconductor device according to Example 3 of the invention. FIGS. 12A and 12B are diagrams illustrating the structure of the semiconductor device according to Example 3 of the invention. FIG. 12A is a cross-sectional view illustrating a main portion of the semiconductor device according to Example 3. FIG. 12B illustrates a net doping concentration distribution along the cutting line A-A' of FIG. 12A.

As illustrated in FIGS. 12A and 12B, an $n^-$ drift layer 2 which is an $n^-$ semiconductor substrate is provided and a p-type base layer 33 which has a higher impurity concentration than the $n^-$ drift layer 2 is provided in a surface layer of a front surface of the $n^-$ semiconductor substrate. An $n^+$ emitter layer 34 which has a higher impurity concentration than the p-type base layer 33 is provided in the p-type base layer 33. A gate electrode 42 is formed so as to face three layers, that is, the $n^+$ emitter layer 34, the p-type base layer 33, and then drift layer 2, with a gate insulating film 43 interposed therebetween. In this way, for example, a known trench-gate-type MOS gate (metal-oxide film-semiconductor insulating gate) structure is provided. Instead of the trench-gate-type MOS gate structure, a known planar-gate-type MOS gate structure may be provided. An emitter electrode 31 is formed on the front surface of the $n^-$ semiconductor substrate so as to come into contact with the $n^+$ emitter layer 34 and the p-type base layer 33. The emitter electrode 31 is electrically insulated from the gate electrode 42 by an interlayer insulating film 41.

A p-type collector layer 39 and an n-type field stop layer 38 are formed on the rear surface side of the $n^-$ semiconductor substrate. The n-type field stop layer 38 is provided at a position that is deeper than the p-type collector layer 39 from the rear surface of the substrate so as to come into contact with the p-type collector layer 39. The n-type field stop layer 38 has a function of suppressing holes which mainly flow from the p-type collector layer 39 in an off state to suppress a leakage current. A collector electrode 32 comes into contact with the p-type collector layer 39. Similarly to Example 1, a plurality of n-type buffer layers 35, 36, and 37 are formed in the $n^-$ drift layer 2 at different depths from the rear surface of the substrate by proton implantation and a heat treatment. Carrier storage regions 45, 46, and 47 which have a lower impurity concentration than the plurality of n-type buffer layers 35, 36, and 37 and the n-type field stop layers 38 are formed between the plurality of n-type buffer layers 35, 36, and 37 and the n-type field stop layer 38 which are adjacent to each other in the depth direction. The n-type field stop layer 38 may be doped with n-type impurities. For example, the n-type field stop layer 38 may include impurities such as phosphorus (P), arsenic (As), or proton (hydrogen).

The distance Y of the position of the peak carrier concentration of the deepest n-type buffer layer 35 from the interface between the p-type collector layer 39 and the collector electrode 32 (the distance from the rear surface of the substrate to the peak position of the deepest n-type buffer layer 35) Y is preferably equal to that in Example 1. In the case of the IGBT, the direction of a current in an on state is from the p-type collector layer 39 to the $n^+$ emitter layer 34, unlike the reverse recovery of the diode. However, when the on-current is turned off, the spatial charge region extends from the pn junction between the p-type base layer 33 close to the front surface of the substrate and the n-type drift layer 2 to the p-type collector layer 39 on the rear surface of the substrate. When the semiconductor device is turned off, holes pass through the spatial charge region in the direction from the rear surface to the front surface of the substrate. The spatial charge region of the diode and the operation of the holes are similar to each other in these two points. Therefore, turn-off oscillation occurs due to the same physical cause as the reverse recovery oscillation in Example 1. In contrast, it is preferable that the distance Y from the rear surface of the substrate to the peak position of the deepest n-type buffer layer 35 be equal to that in Example 1.

As described above, according to Example 3, even when the semiconductor device is an IGBT, it is possible to delay the depletion of holes at the time the semiconductor device is turned off, to suppress the oscillation of the voltage and current at the time the semiconductor device is turned off, and to suppress the generation of radiation noise, similarly to Example 1.

Thus, according to the invention, proton implantation is performed a plurality of times to form a plurality of n-type buffer layers (5, 6, 7) in an n-type drift layer (2) at different depths from a rear surface of a substrate. The depth of the n-type buffer layer (5), which is provided at the deepest position from the rear surface of the substrate, from the rear surface of the substrate is more than 15 pm. The temperature of a heat treatment which is performed in order to change a proton into a donor and to recover a crystal defect after the proton implantation is equal to or higher than 400° C. In a carrier concentration distribution of the n-type buffer layer (5), a width from the peak position (5*a*) of carrier concentration to an anode is more than a width from the peak position (5*a*) to a cathode. The carrier concentration of regions (15, 16) interposed between the n-type buffer layers (5, 6, 7) is flat and is equal to or more than the carrier concentration of an n-type silicon substrate (1) and equal to or less than five times the carrier concentration of the n-type silicon substrate (1). Therefore, it is possible to ensure a breakdown voltage and to reduce generation loss. It is possible to suppress the oscillation of voltage and current during a switching operation. In addition, it is possible to recover the crystal defect and to reduce a leakage current. Accordingly, it is possible to reduce the risk of thermal runaway.

The invention is not limited to the above-described embodiments, but various modifications and changes of the invention can be made without departing from the scope and spirit of the invention. As described above, the semiconductor device and the semiconductor device manufacturing method according to the invention are useful for power conversion devices, such as converters, or power supply devices of various industrial machines.

What is claimed is:

1. A semiconductor device comprising:

a semiconductor substrate having a first main surface and a second main surface, the semiconductor substrate having an n-type drift layer provided therein;

a p-type layer provided between the first main surface of the semiconductor substrate and the drift layer; and an n-type high-concentration layer provided between the second main surface of the semiconductor substrate and the drift layer, the n-type high-concentration layer including a plurality of buffer layers, wherein a carrier concentration of the semiconductor device is higher in the n-type high-concentration layer than in the semiconductor substrate, and in one of the plurality of buffer layers, the carrier concentration decreases both upward and downward in a depth direction of the semiconductor device, from a peak concentration thereof at a peak position to a pre-determined concentration at a first depth position and a second depth position respectively above and below the peak position, the first depth position and the second depth position having the same pre-determined concentration that is a half of the peak concentration, a first width being a distance in the depth direction between the first depth position and the peak position, a second width being a distance in the depth direction between the peak position and the second depth position, the first width being larger than the second width.

2. The semiconductor device according to claim 1, wherein the n-type high-concentration layer includes hydrogen as a donor.

3. The semiconductor device according to claim 2, wherein the carrier concentration is substantially uniform in the drift layer.

4. The semiconductor device according to claim 2, wherein the carrier concentration has a peak concentration in each of the plurality of buffer layers, and decrease from each peak concentration asymmetrically upward and downward in the depth direction.

5. The semiconductor device according to claim 2, wherein the carrier concentration in the n-type high-concentration layer is higher than $1\times10^{14}/cm^3$.

6. The semiconductor device according to claim 2, wherein the plurality of buffer layers include, in the depth direction from the first main surface to the second main surface of the semiconductor substrate, a deepest buffer layer, at least one intermediate buffer layer, and a shallowest buffer layer.

7. The semiconductor device according to claim 6, wherein the carrier concentration has a peak concentration in each of the plurality of buffer layers; and in the semiconductor device:

$Y=W0-(Z+xj)$; and $Z=\alpha W0$, wherein $\alpha$ is equal to or greater than 0.4 and equal to or less than 0.8, W0 is a distance between the first main surface and the second main surface of the semiconductor substrate in the depth direction, xj is a thickness of the p-type layer in the depth direction, Z is a distance in the depth direction from an interface between the p-type layer and the drift layer to the deepest buffer layer, and Y is a distance in the depth direction from the second main surface of the semiconductor substrate to the peak position of the shallowest buffer layer.

8. The semiconductor device according to claim 6, wherein the semiconductor device is a diode, and the semiconductor device further includes an n-type cathode layer between the second main surface of the semiconductor substrate and the shallowest buffer layer.

9. The semiconductor device according to claim 6, wherein the semiconductor device is an Insulated Gate Bipolar Transistor, and the semiconductor device further includes a p-type collector layer between the second main surface of the semiconductor substrate and the shallowest buffer layer.

10. The semiconductor device according to claim 1, wherein the carrier concentration is the same in the drift layer and in the semiconductor substrate.

11. The semiconductor device according to claim 10, wherein the drift layer is in direct contact with the p-type layer and the n-type high-concentration layer.

12. The semiconductor device according to claim 1, wherein a distribution of the carrier concentration of the semiconductor device has a plurality of inflection points between the plurality of buffer layers, the plurality of inflection points corresponding to a plurality of carrier concentrations that become lower in the depth direction from the second main surface toward the first main surface of the semiconductor substrate.

13. The semiconductor device according to claim 1, wherein the n-type high-concentration layer further includes a carrier storage region between adjacent two of the plurality of buffer layers.

14. The semiconductor device according to claim 13, wherein a width of the carrier storage region is longer than a half width of each of the buffer layers.

15. The semiconductor device according to claim 13, wherein the carrier concentration is substantially uniform in the carrier storage region.

16. The semiconductor device according to claim 1, further comprising an active region and a junction termination structure surrounding the active region, wherein the n-type high-concentration layer is provided from the active region to the junction termination structure in a lateral direction.

17. The semiconductor device according to claim 16, wherein the junction termination structure includes a ring-shaped p-type layer provided in the semiconductor substrate at the first main surface thereof.

18. The semiconductor device according to claim 17, wherein the junction termination structure further includes an electrode connected to the ring-shaped p-type layer.

19. The semiconductor device according to claim 6, wherein said one buffer layer is the deepest buffer layer.

20. The semiconductor device according to claim 1, wherein the semiconductor device is a diode.

21. The semiconductor device according to claim 1, wherein the semiconductor device is an Insulated Gate Bipolar Transistor.

22. A semiconductor, comprising:

a semiconductor substrate having a first main surface and a second main surface, the semiconductor substrate having an n-type drift layer provided therein;

a p-type layer provided between the first main surface of the semiconductor substrate and the drift layer; and an n-type high-concentration layer provided between the second main surface of the semiconductor substrate and the drift layer, the n-type high-concentration layer including a plurality of buffer layers, wherein a carrier concentration of the semiconductor device is higher in the n-type high-concentration layer than in the semiconductor substrate, and in one of the plurality of buffer layers, the carrier concentration decreases both upward and downward in a depth direction of the semiconductor device, from a peak concentration thereof at a peak position to a pre-determined concentration at a first depth position and a second depth position respectively above and below the peak position, the first depth position and the second depth position having the same pre-determined concentration that is 1/e times the peak concentration, a first width being a distance in the depth direction between the first depth position and the peak position, a second width being a distance in the depth direction between the peak position and the second depth position, the first width being larger than the second width.

* * * * *